United States Patent
Woo et al.

(10) Patent No.: US 12,302,049 B2
(45) Date of Patent: May 13, 2025

(54) ELECTRONIC DEVICE COMPRISING MICROPHONE MODULE

(71) Applicant: SAMSUNG ELECTRONICS CO., LTD., Suwon-si (KR)

(72) Inventors: Jeong Woo, Suwon-si (KR); Minsik Lim, Suwon-si (KR); Jungchul An, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 242 days.

(21) Appl. No.: 18/106,283

(22) Filed: Feb. 6, 2023

(65) Prior Publication Data

US 2023/0188879 A1 Jun. 15, 2023

Related U.S. Application Data

(63) Continuation of application No. PCT/KR2021/009919, filed on Jul. 29, 2021.

(30) Foreign Application Priority Data

Aug. 4, 2020 (KR) .......................... 10-2020-0097654

(51) Int. Cl.
   *H04R 1/04* (2006.01)
   *H04M 1/02* (2006.01)
   (Continued)

(52) U.S. Cl.
   CPC ............ *H04R 1/04* (2013.01); *H04M 1/0264* (2013.01); *H04N 23/51* (2023.01); *H04N 23/52* (2023.01);
   (Continued)

(58) Field of Classification Search
   CPC .......... H04R 1/04; H04R 1/028; H04R 1/086; H04R 3/00; H04R 2499/11;
   (Continued)

(56) References Cited

U.S. PATENT DOCUMENTS 8,724,840 B2 5/2014 Doller et al.
9,055,143 B2 6/2015 Kim
(Continued)

FOREIGN PATENT DOCUMENTS

JP         11-41682 A     2/1999
JP    2007-208858 A     8/2007
(Continued)

OTHER PUBLICATIONS

International Search Report (PCT/ISA/210) dated Nov. 24, 2021 by the International Searching Authority in International Application No. PCT/KR2021/009919.

(Continued)

*Primary Examiner* — Mark Fischer
(74) *Attorney, Agent, or Firm* — Sughrue Mion, PLLC

(57) ABSTRACT

In an electronic device, at least a portion of a camera cover member is disposed inside a housing. The camera cover member includes a through-hole in fluid communication with the outside of the housing, and is formed to support a camera module disposed inside the housing. A microphone module is disposed inside the housing so as to be adjacent to the camera module, and includes a first circuit board disposed on the camera cover member and a microphone disposed on the first circuit board. A second circuit board is disposed to face the camera cover member with the microphone module therebetween, and includes a contact structure in contact with the first circuit board. The contact structure is configured to electrically connect the first circuit board to the second circuit board and can be disposed between the first circuit board and the second circuit board to surround the microphone.

20 Claims, 18 Drawing Sheets

(51) Int. Cl.
*H04N 23/51* (2023.01)
*H04N 23/52* (2023.01)
*H04R 1/02* (2006.01)
*H04R 1/08* (2006.01)
*H04R 3/00* (2006.01)
*H05K 1/18* (2006.01)
*H05K 7/14* (2006.01)

(52) U.S. Cl.
CPC .............. *H04R 1/028* (2013.01); *H04R 1/086* (2013.01); *H04R 3/00* (2013.01); *H05K 1/18* (2013.01); *H05K 7/1427* (2013.01); *H04R 2499/11* (2013.01); *H04R 2499/15* (2013.01); *H05K 2201/10083* (2013.01); *H05K 2201/10121* (2013.01)

(58) Field of Classification Search
CPC .... H04R 2499/15; H04N 23/51; H04N 23/52; H04M 1/0264; H05K 2201/10083; H05K 2201/10121; H05K 1/18–189; H05K 7/1427–1434
See application file for complete search history.

(56) References Cited

U.S. PATENT DOCUMENTS

| | | |
|---|---|---|
| 9,210,492 B2 | 12/2015 | Dave et al. |
| 9,326,057 B2 | 4/2016 | Lee |
| 9,538,271 B2 | 1/2017 | Iwaya |
| 10,148,800 B1 | 12/2018 | Frederickson et al. |
| 10,257,333 B2 | 4/2019 | Kim et al. |
| 10,425,561 B2 | 9/2019 | Jarvis et al. |
| 10,701,250 B2 | 6/2020 | Jarvis et al. |
| 10,904,412 B2 | 1/2021 | Jarvis et al. |
| 11,477,355 B2 | 10/2022 | Jarvis et al. |
| 2008/0123891 A1 | 5/2008 | Kato et al. |
| 2011/0212755 A1 | 9/2011 | Ishikawa et al. |
| 2012/0121117 A1 | 5/2012 | Kim |
| 2013/0108082 A1 | 5/2013 | Dave et al. |
| 2013/0251183 A1 | 9/2013 | Doller et al. |
| 2014/0112518 A1 | 4/2014 | Lee |
| 2016/0014488 A1 | 1/2016 | Iwaya |
| 2018/0241861 A1 | 8/2018 | Kim et al. |
| 2020/0059579 A1 | 2/2020 | Jarvis et al. |

FOREIGN PATENT DOCUMENTS

| | | |
|---|---|---|
| JP | 2012-134547 A | 7/2012 |
| KR | 10-2008-0023144 A | 3/2008 |
| KR | 10-1709532 B1 | 2/2017 |
| KR | 10-2018-0096178 A | 8/2018 |
| KR | 10-1900282 B1 | 9/2018 |
| KR | 10-2020-0029415 A | 3/2020 |

OTHER PUBLICATIONS

Communication dated Dec. 17, 2024 issued by the Korean Intellectual Property Office in Korean Patent Application No. 10-2020-0097654.

ELECTRONIC DEVICE COMPRISING MICROPHONE MODULE

CROSS-REFERENCE TO RELATED APPLICATIONS

This application is a continuation application of International Application No. PCT/KR2021/009919, filed on Jul. 29, 2021, which is based on and claims priority to Korean Patent Application No. 10-2020-0097654, filed on Aug. 4, 2020 in the Korean Intellectual Property Office, the disclosures of each of which are incorporated by reference herein in their entireties.

BACKGROUND

1. Field

Various embodiments of the disclosure described herein relate to an electronic device including a microphone module, and more particularly, to an electronic device with a microphone module having a combined electrical contact structure and support structure.

2. Description of Related Art

In the related art, an electronic device may include a plurality of microphone modules therein to receive sound from various directions. The electronic device may receive sound from various directions and/or in response to various situations through the plurality of microphone modules. The microphone modules may include a microphone capable of converting sound into an electrical signal.

The electronic device may include a flexible display. The electronic device may extend a display region visually exposed on an outer surface of the electronic device. For example, the flexible display may be disposed in the electronic device so as to be curved, foldable, or rollable.

A microphone module may be disposed in the electronic device so as to be adjacent to a camera, and a microphone hole for receiving sound may be formed in a portion of a camera region. The electronic device may include a sound travel path extending from the microphone module to the microphone hole. The sound travel path may be formed by stacked structures. In this case, the sound travel path may be lengthened due to the stacked structure, and therefore sound may be lost between the stacked structures. Furthermore, due to an error in the assembly of the stacked structures, the center of the width of the sound travel path might not be constant, and therefore a flow of sound may be affected.

The electronic device may include an electrical connection structure and a support structure for signal connection of the microphone module. The microphone module may be electrically connected with a main board in a state of being supported by a separate support structure (e.g., a rear case) disposed in the electronic device. In this case, as the mounting height of the microphone module increases with respect to the main board, there may be a limitation in designing the thickness of the electronic device to be thin.

SUMMARY

Provided is an electronic device for simultaneously implementing an electrical contact structure and a support structure of a microphone module using a contact structure.

An electronic device according to an embodiment of the disclosure includes a housing, a camera cover member, at least a portion of which is disposed in the housing, the camera cover member including a first through-hole in fluid communication with the outside of the housing and being configured to support at least a portion of a camera module disposed in the housing, a microphone module disposed in the housing so as to be adjacent to the camera module, the microphone module including a first circuit board disposed on the camera cover member and a microphone disposed on the first circuit board, and a second circuit board disposed to face the camera cover member with the microphone module therebetween, the second circuit board including a contact structure that makes contact with at least a portion of the first circuit board. The contact structure is configured to electrically connect the first circuit board and the second circuit board and disposed to surround at least a portion of the microphone between a surface of the first circuit board and a surface of the second circuit board.

A foldable electronic device according to an embodiment of the disclosure includes a housing structure including a first housing and a second housing that are folded or unfolded about a folding axis, a hinge module that connects the first housing and the second housing such that the first housing and the second housing are rotatable relative to each other, a flexible display that extends from a portion of the first housing to a portion of the second housing, a camera cover member, at least a portion of which is disposed in the first housing, the camera cover member including a first through-hole in fluid communication with the outside of the first housing and being configured to support at least a portion of a camera module disposed in the first housing, a microphone module disposed in the first housing so as to be adjacent to the camera module, the microphone module including a first circuit board disposed on the camera cover member and a microphone disposed on the first circuit board, an adhesive member disposed between the camera cover member and the first circuit board, the adhesive member having a second through-hole formed therein, the second through-hole in fluid communication with the first through-hole, a waterproof member disposed in the second through-hole, the waterproof member being located between the camera cover member and the first circuit board to cover the first through-hole, and a second circuit board disposed to face the camera cover member with the microphone module therebetween, the second circuit board including a contact structure that makes contact with at least a portion of the first circuit board. The contact structure is configured to electrically connect the first circuit board and the second circuit board and disposed to surround at least a portion of the microphone between a surface of the first circuit board and a surface of the second circuit board.

In the electronic device according to the various embodiments of the disclosure, a total number of the stacked structures forming the conduit through which the microphone receives sound may be reduced. Thus, the structure of the electronic device may be simplified, and a sound-receiving effect of the microphone may be improved.

Furthermore, in the electronic device according to the various embodiments of the disclosure, the electrical contact structure and the support structure between the microphone module and the circuit board may be provided by the same configuration. Thus, the height at which the microphone module is mounted from the circuit board may be decreased, and the electronic device may be implemented to be thin.

Moreover, in the electronic device according to the various embodiments of the disclosure, the mounting height of the microphone module may be decreased. Thus, the hole through which the microphone receives sound may be formed in the lateral direction of the camera cover member, and the design of the electronic device may be improved.

In addition, the disclosure may provide various effects that are directly or indirectly recognized.

BRIEF DESCRIPTION OF THE DRAWINGS

The above and other aspects, features, and advantages of certain embodiments of the present disclosure will be more apparent from the following description taken in conjunction with the accompanying drawings, in which.

In the following description made with respect to the accompanying drawings, similar components will be assigned with similar reference numerals.

DETAILED DESCRIPTION

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

Figure 1:
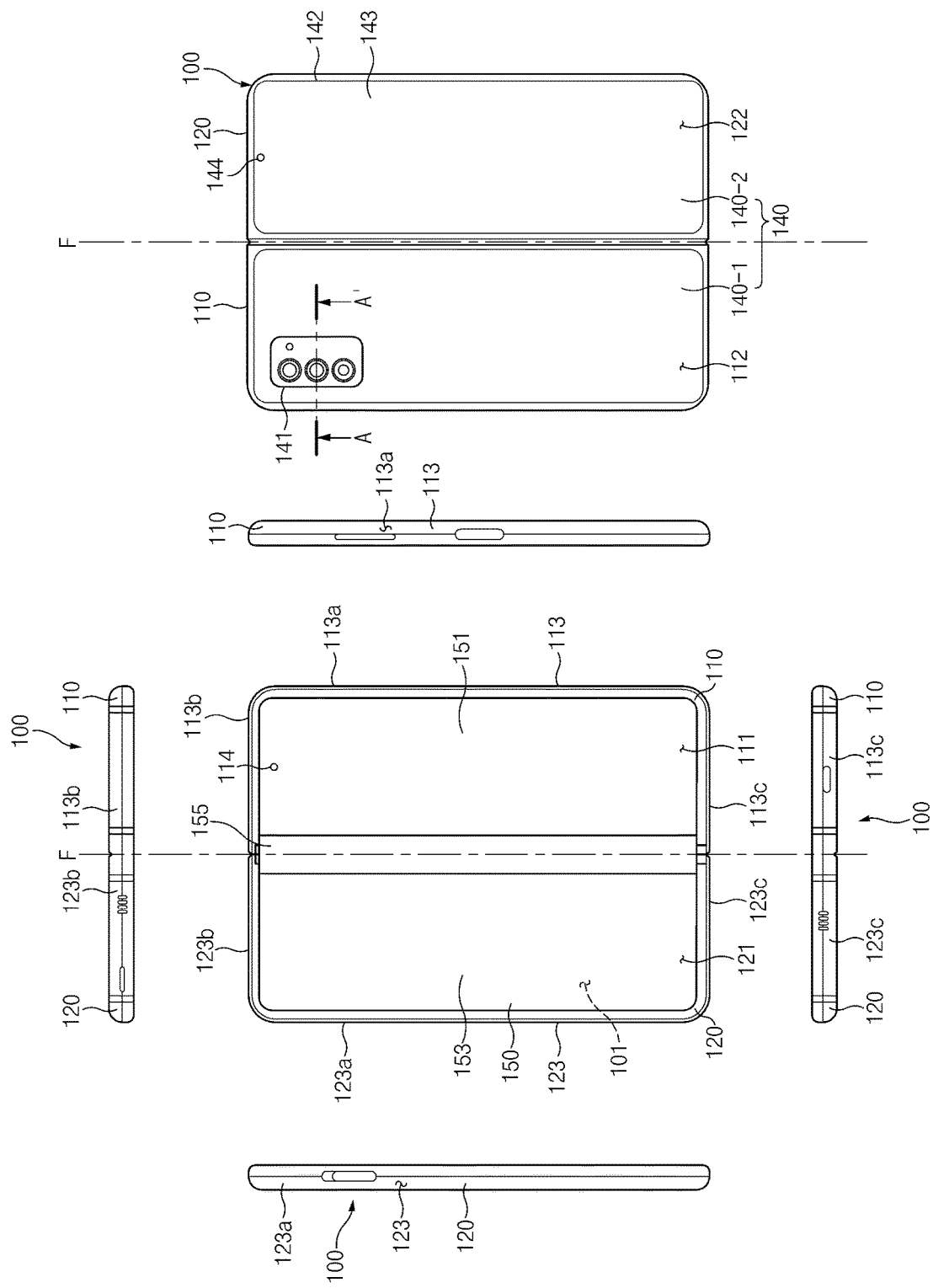
FIG. 1 is a set of orthographic views illustrating an unfolded state of an electronic device, according to an embodiment.
Figure 2:
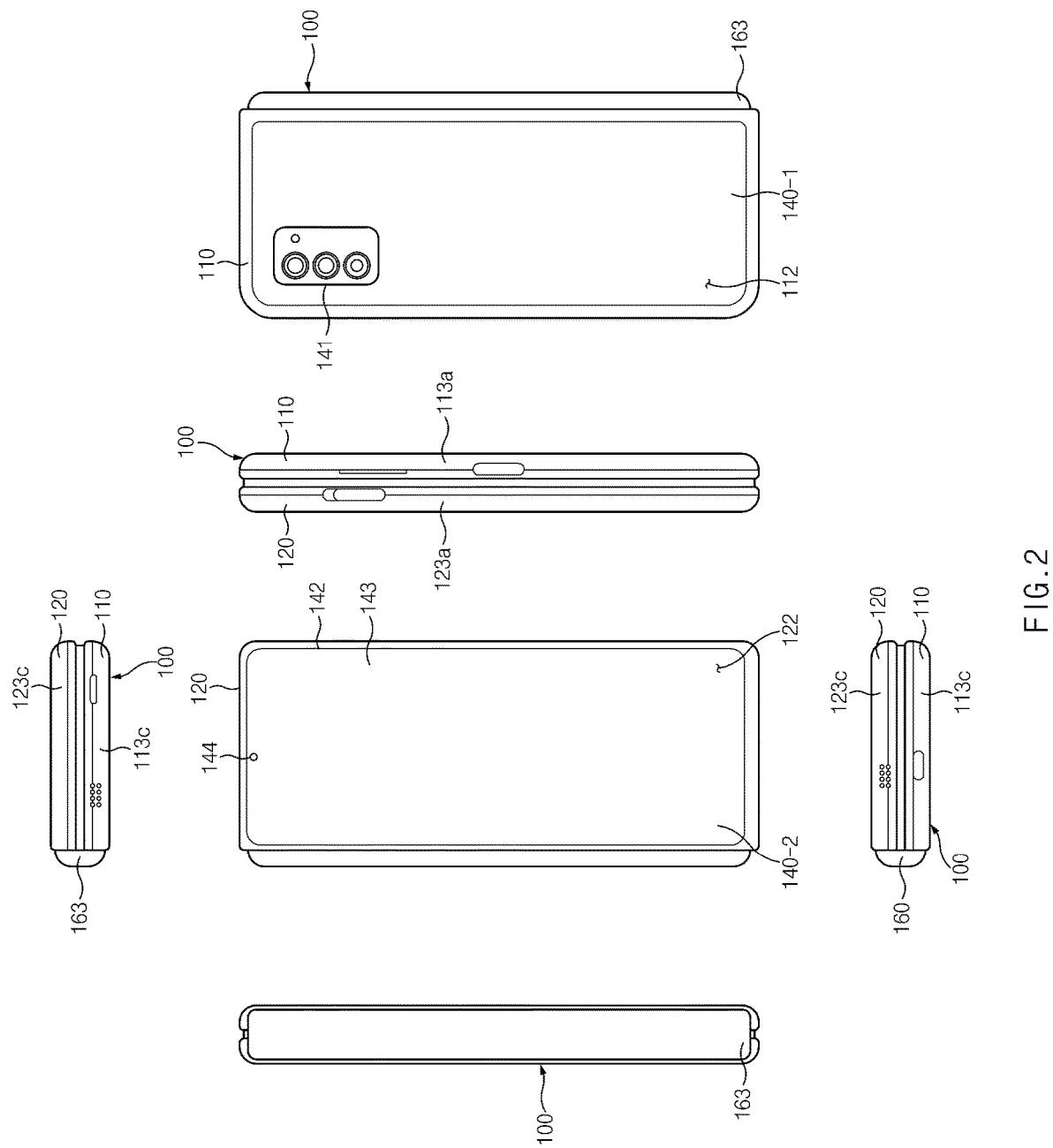
FIG. 2 is a set of orthographic views illustrating a folded state of the electronic device, according to an embodiment.

FIG. 1 is a set of orthographic views illustrating an unfolded state of an electronic device, according to an embodiment. FIG. 2 is a set of orthographic views illustrating a folded state of the electronic device, according to an embodiment.

Referring to FIGS. 1 and 2, the electronic device 100 according to an embodiment may include housing structures 110 and 120, a back cover 140, a flexible display 150, and/or a hinge cover 163.

According to an embodiment, the electronic device 100 may be a foldable electronic device (e.g., a flexible display device) that can be changed to the unfolded state (e.g., the state of FIG. 1) and the folded state (e.g., the state of FIG. 2). The electronic device 100 may include a pair of housing structures 110 and 120 (e.g., foldable housing structures) coupled so as to be folded or unfolded relative to each other, the hinge cover 163 that covers foldable portions of the housing structures 110 and 120, and the flexible display 150 disposed in a space formed by the housing structures 110 and 120.

In an embodiment of the disclosure, a surface on which the flexible display 150 is disposed may be defined as a front surface of the electronic device 100, and a surface facing away from the front surface may be defined as a rear surface of the electronic device 100. Furthermore, surfaces surrounding a space between the front surface and the rear surface may be defined as side surfaces of the electronic device 100.

In an embodiment, the housing structures 110 and 120 may include the first housing 110 and the second housing 120.

In an embodiment, the first housing 110 and the first housing 120 may be folded or unfolded about a virtual folding axis F relative to each other. The first housing 110 and the second housing 120 may be coupled so as to be rotatable about virtual rotational axes that are formed over the flexible display 150 and substantially parallel to the folding axis F. For example, the virtual rotational axes may be formed by a hinge structure (e.g., a hinge structure 160 of FIG. 3).

In an embodiment, the first housing 110 and the second housing 120 may be disposed on opposite sides with respect to the folding axis F and may have substantially symmetrical shapes with respect to the folding axis F. The angle or distance between the first housing 110 and the second housing 120 may vary depending on whether the electronic device 100 is in the unfolded state (or, an opened state), the folded state (or, a closed state), or an intermediate state. According to various embodiments of the disclosure, the first housing 110 and the second housing 120 may have asymmetric shapes with respect to the folding axis F. For example, when the electronic device 100 is in the folded state, the first housing 110 and the second housing 120 may be folded in an asymmetric form about the folding axis F such that a portion of the flexible display 150 is exposed outside the electronic device 100. Unlike the second housing 120, the first housing 110 may include a front camera region 114. In another embodiment, a front camera region 114 may be disposed in at least a partial region of the second housing 120, in addition to or instead of the front camera region 114 of the first housing 110.

In an embodiment, the first housing 110 may include a first surface 111 disposed to face toward the front surface of the electronic device 100 in the unfolded state of the electronic device 100, a second surface 112 facing away from the first surface 111, and a first side member 113 surrounding at least a portion of a space between the first surface 111 and the second surface 112. The first surface 111 may overlap at least a portion of the flexible display 150 (e.g., a first flat region 151 or a folding region 155), and the second surface 112 may overlap at least a portion of the back cover 140 (e.g., a first back cover 140-1). The first side member 113 may include a first side surface 113*a* disposed substantially parallel to the folding axis F, a second side surface 113*b* extending from one end of the first side surface 113*a* in a direction substantially perpendicular to the folding axis F, and a third side surface 113*c* extending from an opposite end of the first side surface 113*a* in the direction substantially perpendicular to the folding axis F.

In an embodiment, the second housing 120 may include a third surface 121 disposed to face toward the front surface of the electronic device 100 in the unfolded state of the electronic device 100, a fourth surface 122 facing away from the third surface 121, and a second side member 123 surrounding at least a portion of a space between the third surface 121 and the fourth surface 122. The third surface 121 may overlap at least a portion of the flexible display 150 (e.g., a second flat region 153 or the folding region 155), and the fourth surface 122 may overlap at least a portion of the back cover 140 (e.g., a second back cover 140-2). The second side member 123 may include a fourth side surface 123*a* disposed substantially parallel to the folding axis F, a fifth side surface 123*b* extending from one end of the fourth side surface 123*a* in a direction substantially perpendicular to the folding axis F, and a sixth side surface 123*c* extending from an opposite end of the fourth side surface 123*a* in the direction substantially perpendicular to the folding axis F. The first surface 111 and the third surface 121 may face each other in the folded state of the electronic device 100 and may face the same direction in the unfolded state of the electronic device 100.

In an embodiment, through a structural coupling of the first housing 110 and the second housing 120, the electronic device 100 may form a display receiving portion 101 in which the flexible display panel is accommodated and/or disposed. The display receiving portion 101 may have substantially the same shape or size as the flexible display 150. The display receiving portion 101 may be formed over the first surface 111 of the first housing 110 and the third surface 121 of the second housing 120. At least portion of the first housing 110 and at least a portion of the second housing 120 may be formed of a metallic material or a non-metallic material. At least a portion of the first housing 110 and at least a portion of the second housing 120 may be formed of a metallic or non-metallic material having a specified stiffness to support the flexible display panel.

In an embodiment, the front camera region 114 may be formed in the first housing 110. A camera module (e.g., a second camera module 193 of FIG. 4) may be visually exposed through the front camera region 114. For example, the second camera module 193 exposed through the front camera region 114 may be a punch hole camera disposed in a hole or recess formed on a rear surface of the flexible display 150. According to various embodiments of the disclosure, the second camera module 193 may be disposed under the flexible display 150, or may be disposed in the flexible display 150, so as not to be exposed outside the electronic device 100 (e.g., an under display camera (UDC)).

In an embodiment, the back cover 140 may include the first back cover 140-1 and the second back cover 140-2.

The first back cover 140-1 may be disposed on the second surface 112 of the first housing 110 and may have a substantially rectangular periphery. At least a portion of the periphery may be surrounded by the first housing 110. The second back cover 140-2 may be disposed on the fourth surface 122 of the second housing 120, and at least a portion of a periphery of the second back cover 140-2 may be surrounded by the second housing 120. According to the illustrated embodiment, the first back cover 140-1 and the second back cover 140-2 may have substantially symmetric shapes with respect to the folding axis F. However, without being limited to the illustrated embodiment, the first back cover 140-1 and the second back cover 140-2 may be formed in various shapes. Furthermore, according to an embodiment to which the disclosure is applied, the first back cover 140-1 may be integrally formed with the first housing 110, and the second back cover 140-2 may be integrally formed with the second housing 120.

In an embodiment, the first housing 110, the second housing 120, the first back cover 140-1, and the second back cover 140-2 may provide, through a mutually coupled structure, a space in which various components (e.g., a printed circuit board, an antenna module, a sensor module, or a battery) of the electronic device 100 are disposed.

One or more components may be disposed, or visually exposed, on the rear surface of the electronic device 100. For example, a camera module (e.g., a third camera module 194 of FIG. 4) may be visually exposed through a first camera region 141 of the first back cover 140-1. For example, the third camera module 194 may include at least one rear camera (e.g., cameras 194*a*, 194*b*, and 194*c* of FIGS. 10 and 11 and/or a flash (e.g., a flash 194*d* of FIGS. 10 and 11)). Furthermore, at least a portion of a cover display 143 may be visually exposed through a rear display region 142 of the second back cover 140-2. Moreover, a camera module (e.g., a first camera module 192 of FIG. 4) may be visually exposed through a second camera region 144 of the second back cover 140-2. The first camera module 192 may include a punch hole camera disposed in a hole or recess formed on a rear surface of the cover display 143.

In an embodiment, the flexible display 150 may be disposed over the space formed by the housing structures 110 and 120. For example, the flexible display 150 may be seated in the display receiving portion 101, which is formed by the housing structures 110 and 120, so as to be disposed on the first surface 111 of the first housing 110 and the third surface 121 of the second housing 120. The flexible display 150 may be disposed to occupy substantially the entire front surface of the electronic device 100.

In an embodiment, the flexible display 150 may mean a display, at least a partial region of which is deformable to be flat or curved. The flexible display 150 may include the folding region 155, the first flat region 151 disposed on one side with respect to the folding region 155 (e.g., on the right side of the folding region 155), and the second flat region 153 disposed on an opposite side with respect to the folding region 155 (e.g., on the left side of the folding region 155).

In an embodiment, the first flat region 151 may be disposed on the first surface 111 of the first housing 110, and the second flat region 153 may be disposed on the third surface 121 of the second housing 120. The division of the flexible display 150 into the regions is illustrative, and the flexible display 150 may be divided into a plurality of regions (e.g., four or more region, or two regions) depending on the structure or function of the flexible display 150. For example, according to the illustrated embodiment, the regions of the flexible display 150 may be divided from each other by the folding region 155 or the folding axis F. However, in another embodiment, the flexible display 150 may be divided into regions with respect to another folding region or another folding axis (e.g., another folding axis substantially perpendicular to the folding axis F). The above-described division of the flexible display 150 into the regions merely corresponds to physical division by the first housing 110, the second housing 120, and the hinge structure (e.g., the hinge structure 160 of FIG. 3), and the flexible display 150 may be configured such that an entire screen is displayed by using the first housing 110, the second housing 120, and the hinge structure 160.

According to the illustrated embodiment, the first flat region 151 and the second flat region 153 may have shapes that are entirely symmetrical to each other with respect to the folding region 155. However, the disclosure is not limited to the illustrated embodiment, and according to various embodiments of the disclosure, one of the first flat region 151 and the second flat region 153 may include a cut-out notch region.

In an embodiment, the hinge cover 163 may be disposed between the first housing 110 and the second housing 120 such that a hinge module (e.g., a hinge module 161 of FIGS. 3 and 4) is not exposed to the outside. The hinge cover 163 may be hidden by a portion of the first housing 110 and a portion of the second housing 120, or may be exposed outside the housing structures 110 and 120, depending on an operational state (an unfolded state or a folded state) of the electronic device 100. For example, when the electronic device 100 is in an unfolded state (refer to FIG. 1), the hinge cover 163 may be hidden by the first housing 110 and the second housing 120 and may remain unexposed on the exterior of the electronic device 100. In another example, when the electronic device 100 is in a folded state (e.g., a completely folded state) (refer to FIG. 2), the hinge cover 163 may be exposed outside the electronic device 100 from between the first housing 110 and the second housing 120. In another example, when the electronic device 100 is in an intermediate state in which the first housing 110 and the second housing 120 are folded with a certain angle, the hinge cover 163 may be at least partially exposed outside the electronic device 100 from between the first housing 110 and the second housing 120. The region where the hinge cover 163 is exposed outside the electronic device 100 in the intermediate state may be smaller than the region exposed in the folded state (refer to FIG. 2). The hinge cover 163 may at least partially include a curved surface.

Hereinafter, operations of the first housing 110 and the second housing 120 and states of the regions of the flexible display 150 depending on operational states (e.g., an unfolded state and a folded state) of the electronic device 100 will be described.

In an embodiment, when the electronic device 100 is in the unfolded state (refer to FIG. 1), the first housing 110 and the second housing 120 may form the same plane while substantially forming an angle of 180 degrees. The first flat region 151 and the second flat region 153 of the flexible display 150 may be disposed to face the same direction. The folding region 155 of the flexible display 150 may form the same plane as the first flat region 151 and the second flat region 153. In the unfolded state, the first flat region 151, the second flat region 153, and the folding region 155 may form a screen display area while being exposed on the front surface of the electronic device 100.

In an embodiment, when the electronic device 100 is in the folded state (refer to FIG. 2), the first housing 110 and the second housing 120 may be disposed to face each other. The first flat region 151 and the second flat region 153 of the flexible display 150 may face each other while forming a narrow angle (e.g., between 0 degrees and 10 degrees). At least a portion of the folding region 155 may be formed to be a curved surface having a predetermined curvature.

In an embodiment, when the electronic device 100 is in an intermediate state (not illustrated), the first housing 110 and the second housing 120 may be disposed at a certain angle. The intermediate state may mean a state in which the electronic device 100 is changed between the unfolded state and the folded state. For example, the intermediate state may mean a state before the first housing 110 and the second housing 120 are completely unfolded. The angle between the first flat region 151 and the second flat region 153 of the flexible display 150 in the intermediate state may be greater than the angle in the folded state and may be smaller than the angle in the unfolded state. At least a portion of the folding region 155 may be formed to be a curved surface having a predetermined curvature, and the curvature may be smaller than the curvature in the folded state and may be greater than the curvature in the unfolded state.

The electronic device 100 according to the illustrated embodiment may be an in-folding electronic device in which the flexible display 150 is folded inward such that the flexible display 150 is not exposed outside the electronic device 100 in the folded state. In another embodiment (not illustrated), the electronic device may be an out-folding electronic device in which the flexible display 150 is folded outward such that the flexible display 150 is visually exposed outside the electronic device 100 in the folded state. In another embodiment (not illustrated), the electronic device may be a multi-folding electronic device in which in-folding and out-folding are combined.

The electronic device 100 according to the illustrated embodiment may be an electronic device 100 of a foldable type. However, electronic devices according to various embodiments of the disclosure may include various types of electronic devices without being limited the electronic device 100 illustrated in FIGS. 1 and 2 (e.g., the electronic device 100 of FIGS. 3 and 4). For example, the electronic devices may include a bar type electronic device (not illustrated) and a slidable (or, rollable) electronic device (not illustrated).

Figure 3:
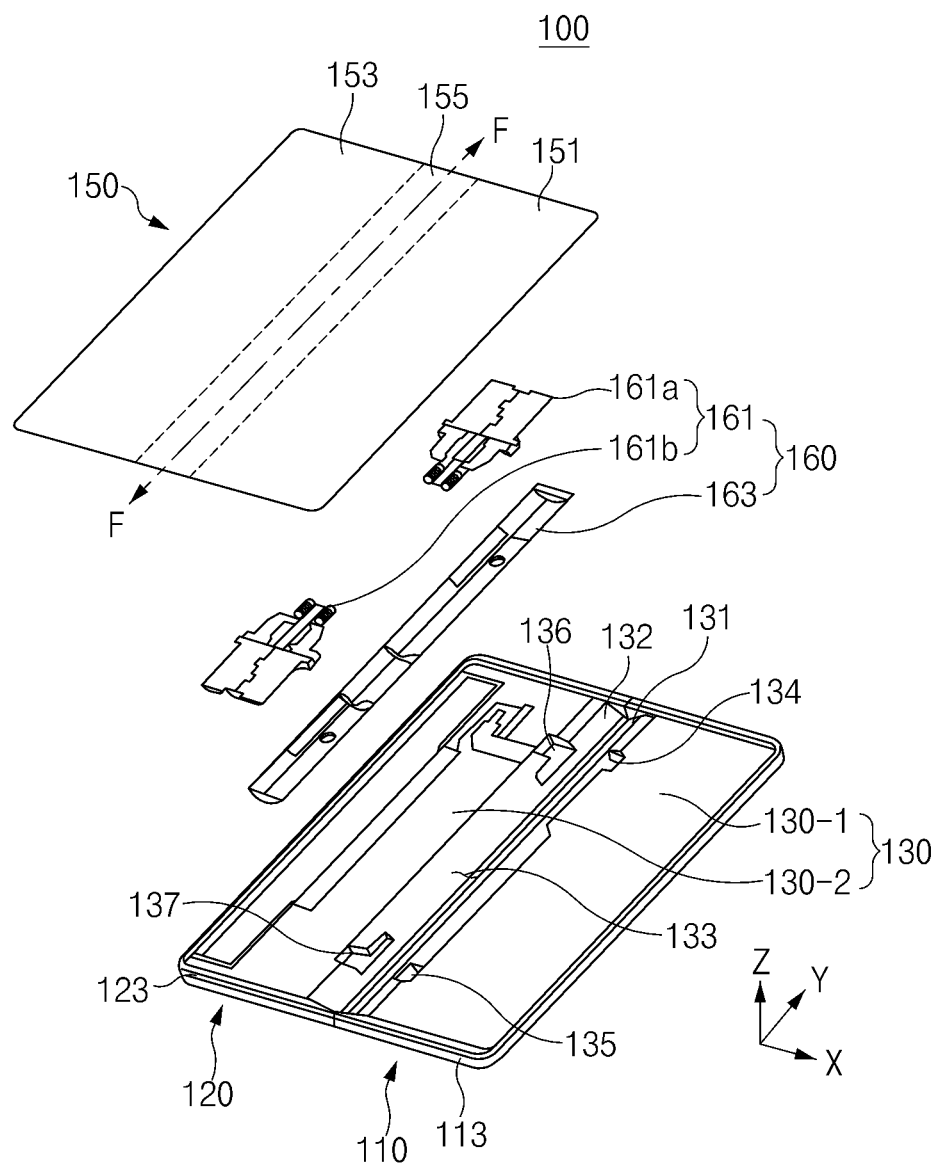
FIG. 3 is an exploded perspective view of the electronic device as viewed in a front direction, according to an embodiment.
Figure 4:
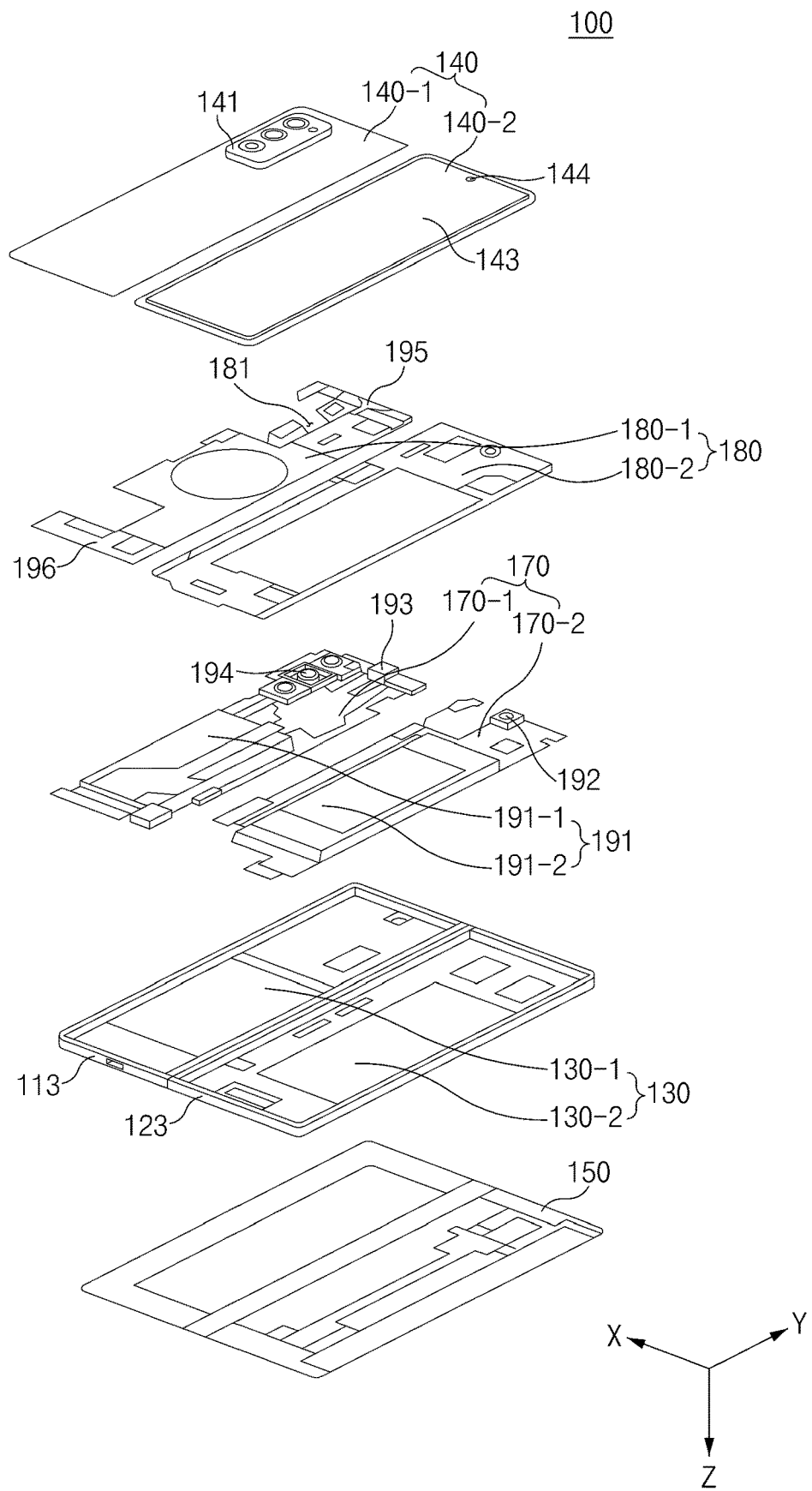
FIG. 4 is an exploded perspective view of the electronic device as viewed in a rear direction, according to an embodiment.

FIGS. 3 and 4 are exploded perspective views of the electronic device according to an embodiment. Namely, FIG. 3 is an exploded perspective view of the electronic device as viewed in a front direction, and FIG. 4 is an exploded perspective view of the electronic device as viewed in a rear direction.

Referring to FIGS. 3 and 4, the electronic device 100 according to an embodiment may include the first housing 110, the second housing 120, a support plate 130, the back cover 140, the flexible display 150, the hinge structure 160, a second circuit board 170, a support member 180 (e.g., a rear case), a battery 191, the camera modules 192, 193, and 194, and/or antennas 195 and 196. Some of the components of the electronic device 100 illustrated in FIGS. 3 and 4 may be identical or similar to some of the components of the electronic device 100 illustrated in FIGS. 1 and 2, and repetitive descriptions will hereinafter be omitted.

In an embodiment, the housing structures 110 and 120 may include the side members 113 and 123 (e.g., a side bezel structure) and the support plate 130. The first housing 110 may include the first side member 113 that forms at least a portion of the side surface of the first housing 110. The second housing 120 may include the second side member 123 that forms at least a portion of the side surface of the second housing 120. A first support plate 130-1 may be connected with the first side member 113, or may be integrally formed with the first side member 113. A second support plate 130-2 may be connected with the second side member 123, or may be integrally formed with the second side member 123. For example, the first support plate 130-1 may partially face the first flat region 151 of the flexible display 150, and the second support plate 130-2 may partially face the second flat region 153 of the flexible display 150.

In an embodiment, the housing structures 110 and 120 may include, between the first support plate 130-1 and the second support plate 130-2, a recess 133 in which at least a portion of the hinge cover 163 is disposed. The recess 133 may be formed such that at least a portion thereof has a predetermined curvature to correspond to the shape of the hinge cover 163. When the electronic device 100 is in an unfolded state (e.g., the state of FIG. 1), a first support surface 131 and a second support surface 132 may form the recess 133 to cover the hinge cover 163, thereby preventing the hinge cover 163 from being exposed on the rear surface of the electronic device 100, or reducing an exposed region of the hinge cover 163. In contrast, when the electronic device 100 is in a folded state (e.g., the state of FIG. 2), the first support surface 131 and the second support surface 132 may move along the curved surface of the hinge cover 163 to positions facing each other and may expose the hinge cover 163 outside the electronic device 100.

In an embodiment, the housing structures 110 and 120 may include steps 134, 135, 136, and 137 on which at least portions of the hinge structure 160 are seated. For example, the first housing 110 may include the first step 134 on which a portion of a first hinge module 161*a* is seated and the second step 135 on which a portion of a second hinge module 161*b* is seated. The second housing 120 may include the third step 136 on which a portion of the first hinge module 161*a* is seated and the fourth step 137 on which a portion of the second hinge module 161*b* is seated. The steps 134, 135, 136, and 137 may be formed adjacent to the recess 133 in which the hinge cover 163 is disposed.

In an embodiment, the hinge structure 160 may include the hinge module 161 and the hinge cover 163. The hinge module 161 may include the first hinge module 161*a* and the second hinge module 161*b* aligned with each other in a direction substantially parallel to the folding axis F. For example, the hinge module 161 may connect the first housing 110 and the second housing 120 such that the first housing 110 and the second housing 120 are rotatable relative to each other. The hinge module 161 may be disposed between the first housing 110 and the second housing 120 and may be coupled to the first housing 110 and the second housing 120.

In an embodiment, the second circuit board 170 may include a first substrate 170-1 disposed in the first housing 110 and a second substrate 170-2 disposed in the second housing 120. The first substrate 170-1 may be disposed between a first support member 180-1 and the first support plate 130-1. The second substrate 170-2 may be disposed between a second support member 180-2 and the second support plate 130-2. According to various embodiments of the disclosure, the second circuit board 170 may be configured such that the first substrate 170-1 and the second substrate 170-2 are electrically connected with each other.

In an embodiment, a processor, a memory, and/or an interface may be disposed on the second circuit board 170. For example, the processor may include one or more of a central processing unit, an application processor, a graphic processing unit, an image signal processor, a sensor hub processor, or a communication processor. For example, the memory may include a volatile memory or a non-volatile memory. For example, the interface may include a high definition multimedia interface (HDMI), a universal serial bus (USB) interface, an SD card interface, and/or an audio interface. The interface may electrically or physically connect the electronic device 100 with an external electronic device and may include a USB connector, an SD card/MMC connector, or an audio connector.

In an embodiment, the camera modules 192, 193, and 194 may be disposed on the second circuit board 170. For example, the second camera module 193 facing toward the front surface of the electronic device 100 and the third camera module 194 facing toward the rear surface of the electronic device 100 may be disposed on the first substrate 170-1 of the second circuit board 170. The first camera module 192 facing toward the rear surface of the electronic device 100 may be disposed on the second substrate 170-2 of the second circuit board 170. According to various embodiments of the disclosure, at least a portion of the third camera module 194 may be visually exposed through the first camera region 141 of the first back cover 140-1. Furthermore, at least a portion of the second camera module 193 may be visually exposed through the second camera region 144 of the second back cover 140-2.

In an embodiment, the support member 180 may be disposed between the back cover 140 and the second circuit board 170. The support member 180 may include the first support member 180-1 disposed in the first housing 110 and the second support member 180-2 disposed in the second housing 120. For example, the first support member 180-1 may be disposed between the first substrate 170-1 of the second circuit board 170 and the first back cover 140-1. The second support member 180-2 may be disposed between the second substrate 170-2 of the second circuit board 170 and the second back cover 140-2. According to an embodiment, the first support member 180-1 may include an open region 181 through which the third camera module 194 disposed on the first substrate 170-1 of the second circuit board 170 faces the first camera region 141.

In an embodiment, the battery 191, which is a device for supplying power to at least one component of the electronic device 100, may include, for example, a primary cell that is not rechargeable, a secondary cell that is rechargeable, or a fuel cell. The battery 191 may include a first battery 191-1 disposed in the first housing 110 and a second battery 191-2 disposed in the second housing 120. The first battery 191-1 may be coupled to the first substrate 170-1, and the second battery 191-2 may be coupled to the second substrate 170-2. For example, at least a portion of the battery 191 may be disposed on substantially the same plane as the second circuit board 170. According to various embodiments of the disclosure, the battery 191 may be integrally disposed inside the electronic device 100, or may be disposed to be detachable from the electronic device 100.

In an embodiment, the antennas 195 and 196 may be formed by portions of the side members 113 and 123 and/or a portion of the support member 180, or a combination thereof. For example, the antennas 195 and 196 may include the first antenna 195 disposed on one side of the first support member 180-1 (e.g., in the +y-axis direction) and the second antenna 196 disposed on an opposite side of the first support member 180-1 (e.g., in the −y-axis direction). The antennas 195 and 196 may include a near field communication (NFC) antenna, a wireless charging antenna, and/or a magnetic secure transmission (MST) antenna. For example, the antennas 195 and 196 may perform short-range communication with an external device, or may wirelessly transmit and receive power used for charging. In another embodiment (not illustrated), the antennas may be disposed between the back cover 140 and the battery 191.

Figure 5A:
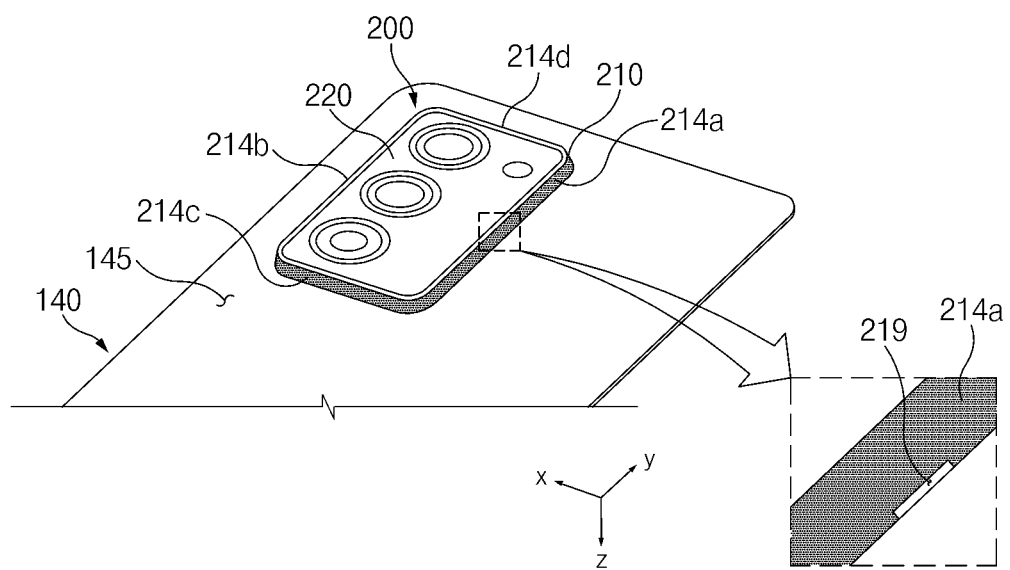
FIG. 5A is a perspective view illustrating a back cover and a camera structure of the electronic device coupled to the back cover, as viewed in a rear direction, according to an embodiment.
Figure 5B:
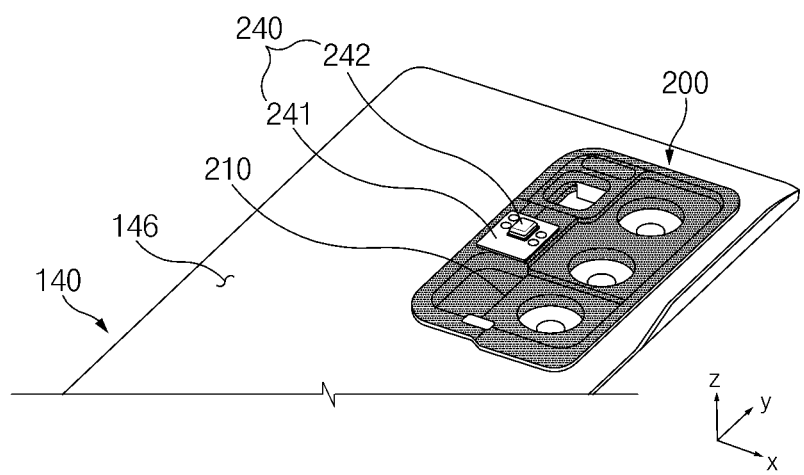
FIG. 5B is a perspective view illustrating the back cover and the camera structure of the electronic device coupled to the back cover, as viewed in a front direction, according to an embodiment.
Figure 6:
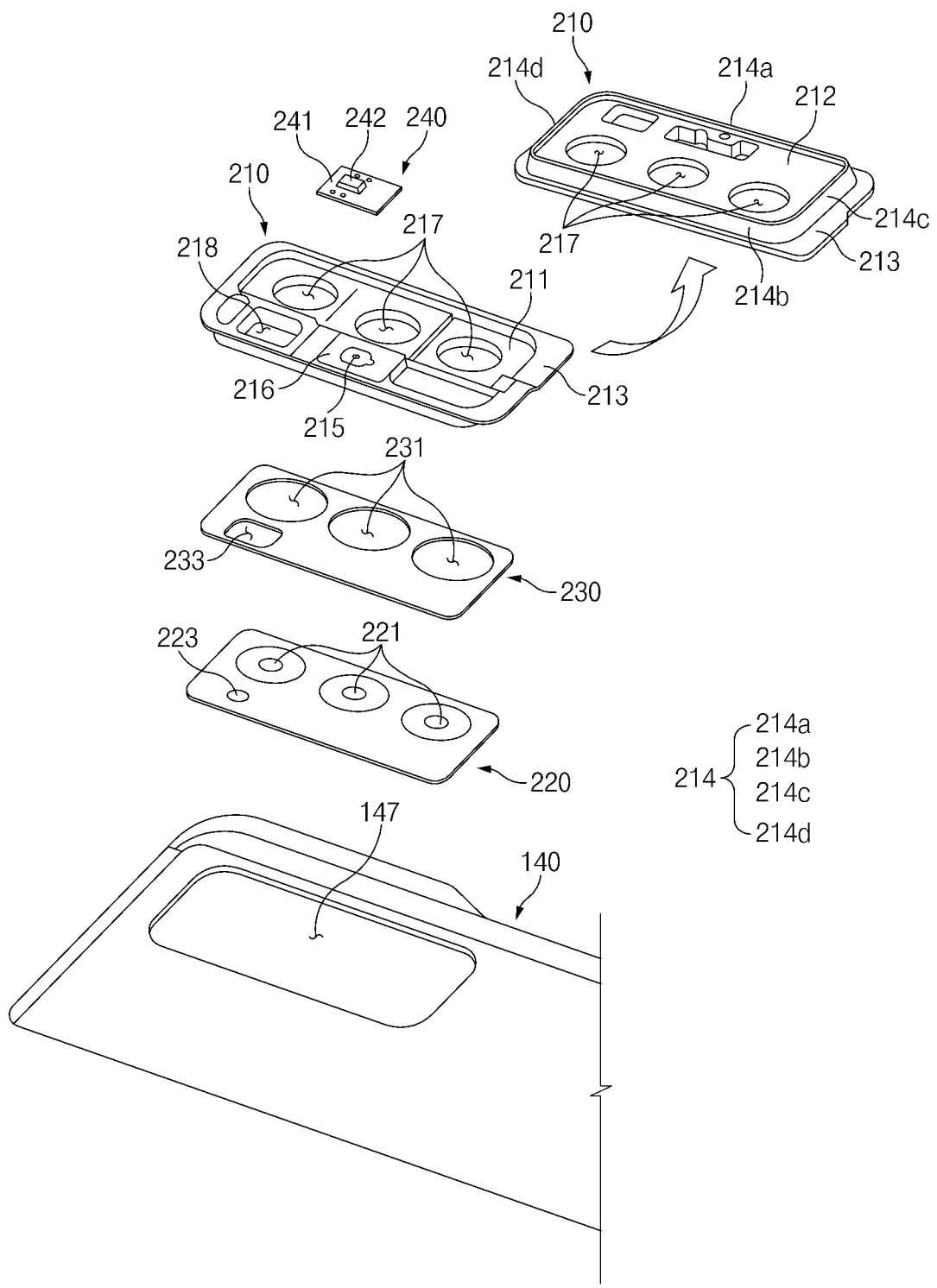
FIG. 6 is an exploded perspective view illustrating the back cover and the camera structure of the electronic device in a separated state, according to an embodiment.

FIGS. 5A and 5B are perspective views illustrating the back cover and a camera structure of the electronic device coupled to the back cover, as respectively viewed in rear and front directions, according to an embodiment. FIG. 6 is an exploded perspective view illustrating the back cover and the camera structure of the electronic device in a separated state, according to an embodiment.

Referring to FIGS. 5A, 5B, and 6, the electronic device according to an embodiment (e.g., the electronic device 100 of FIGS. 1 to 4) may include the back cover 140 (e.g., the first back cover 140-1 of FIGS. 1 to 4) that forms at least a portion of the rear surface of the electronic device 100 and the camera structure 200 (e.g., a decorative structure) that forms a camera region (e.g., the first camera region 141 of FIGS. 1, 2, and 4) on the rear surface of the electronic device 100.

In an embodiment, the back cover 140 may include a first surface 145 exposed outside the electronic device 100 to form the rear surface of the electronic device (e.g., the electronic device 100 of FIGS. 1 to 4) and a second surface 146 facing away from the first surface 145. For example, the first surface 145 of the back cover 140 may substantially face the −z-axis direction. The second surface 146 of the back cover 140 may substantially face the +z-axis direction. The back cover 140 may include an open region 147 in which the camera structure 200 is disposed. For example, the electronic device 100 may be configured such that the camera region (e.g., the first camera region 141 of FIGS. 1, 2, and 4) is formed in a portion of the back cover 140 as the camera structure 200 is exposed through the open region 147 in the direction toward the first surface 145 of the back cover 140.

In an embodiment, the camera structure 200 may be coupled to the back cover 140. The camera structure 200 may be at least partially disposed in the open region 147 of the back cover 140. For example, a portion of the camera structure 200 may protrude from the first surface 145 of the back cover 140 by a specified height through the open region 147 of the back cover 140. The remaining portion other than the portion protruding from the first surface 145 of the back cover 140 may be disposed in the housing (e.g., the first housing 110 or the second housing 120 of FIGS. 1 to 4). The camera structure 200 according to an embodiment may include a camera cover member 210 (e.g., a camera decoration member), a camera window 220, a window tape 230, and a microphone module 240.

In an embodiment, the camera cover member 210 for supporting and/or fixing a camera module (e.g., the third camera module 194 of FIG. 3) may surround at least a portion of the camera module 194. For example, the camera cover member 210 may include at least one opening 217 and 218 in which at least a portion of the camera module 194 is accommodated.

In an embodiment, the opening 217 and 218 may include a plurality of openings 217 and 218. For example, the opening 217 and 218 may include the first openings 217 in which cameras (e.g., the cameras 194a, 194b, and 194c of FIGS. 10 and 11) included in the camera module (e.g., the third camera module 194 of FIG. 3) are accommodated and the second opening 218 in which a flash of the camera module 194 (e.g., the flash 194d of FIGS. 10 and 11) is accommodated. According to various embodiments, one or more first openings 217 may be formed to correspond to the number of cameras 194a, 194b, and 194c included in the camera module 194. According to the illustrated embodiment, the camera cover member 210 may include three first openings 217 in which the three cameras 194a, 194b, and 194c are accommodated. However, this is illustrative, and according to various embodiments of the disclosure, the number of first openings 217 may be changed.

In an embodiment, the camera cover member 210 may include a first seating surface 211 on which the microphone module 240 is seated and a second seating surface 212 on which the camera window 220 is disposed. The first seating surface 211 may mean a surface facing the same direction (e.g., the +z-axis direction) as the second surface 146 of the back cover 140. The second seating surface 212 may mean a surface that faces away from the first seating surface 211 and faces the same direction (e.g., the −z-axis direction) as the first surface 145 of the back cover 140. For example, the first openings 217 and the second opening 218 of the camera cover member 210 may penetrate in the z-axis direction from a partial region of the first seating surface 211 to a partial region of the second seating surface 212.

In an embodiment, the first seating surface 211 may include a microphone region 216 on which the microphone module 240 is disposed. The microphone region 216 may be formed on at least a partial region of the first seating surface 211. For example, the microphone module 240 may be attached to the microphone region 216 through an adhesive means (e.g., an adhesive member 250 or a waterproof member 260 of FIGS. 7B and 8). The microphone region 216 may be formed in a shape corresponding to a portion of the microphone module 240 (e.g., the first circuit board 241). A first through-hole 215 through which the microphone module 240 receives sound may be formed in the microphone region 216. For example, the first through-hole 215 may be configured to be in fluid communication with the outside of the electronic device (e.g., the electronic device 100 of FIGS. 1 to 4 and 9) through a microphone hole 219.

In an embodiment, the second seating surface 212 may protrude from the first surface 145 of the back cover 140 together with a peripheral portion 213 when the camera cover member 210 is coupled to the back cover 140. For example, the second seating surface 212 may be located in a higher position by a predetermined height in the −z-axis direction than the first surface 145 of the back cover 140. The window tape 230 may be disposed between the second seating surface 212 and the camera window 220 and may attach the camera window 220 to the second seating surface 212.

In an embodiment, the camera cover member 210 may include the peripheral portion 213 brought into contact with the second surface 146 of the back cover 140. The peripheral portion 213 may extend in lateral directions along the periphery of the first seating surface 211. For example, the peripheral portion 213 may extend from the periphery of the first seating surface 211 in the x-axis direction and the y-axis direction. The peripheral portion 213 may be seated on the second surface 146 of the back cover 140 when the camera cover member 210 is coupled to the back cover 140. For example, the peripheral portion 213 may be attached to a partial region of the second surface 146 of the back cover 140 to couple the camera cover member 210 and the back cover 140. According to an embodiment, the camera cover member 210 may be configured such that as the peripheral portion 213 is brought into contact with a portion surrounding the open region 147 of the second surface 146 of the back cover 140, a portion of the camera cover member 210 is located outside the housing (e.g., the first housing 110 or the second housing 120 of FIGS. 1 to 4) and the remaining portion is located outside the housing 110 and 120.

In an embodiment, the camera cover member 210 may include a sidewall portion 214 surrounding a space between the first seating surface 211 and the second seating surface 212. For example, the sidewall portion 214 may be configured to protrude from the peripheral portion 213 by a predetermined height in a direction (e.g., the −z-axis direction) toward the second seating surface 212. At least part of the sidewall portion 214 may be disposed in the open region 147. For example, when the peripheral portion 213 is brought into contact with the second surface 146 of the back cover 140, part of the sidewall portion 214 may be surrounded by the open region 147, and the remaining part of the sidewall portion 214 may pass through the open region 147 and may protrude from the first surface 145 of the back cover 140.

In an embodiment, the sidewall portion 214 may include a first sidewall 214a located adjacent to the first through-hole 215, a second sidewall 214b facing the first sidewall 214a, a third sidewall 214c connecting one end portion of the first sidewall 214a and one end portion of the second sidewall 214b, and a fourth sidewall 214d connecting an opposite end portion of the first sidewall 214a and an opposite end portion of the second sidewall 214b. For example, the first sidewall 214a may extend in the y-axis direction, and the second sidewall 214b may be disposed in the +x-axis direction with respect to the first sidewall 214a to face the first sidewall 214a in parallel. The third sidewall 214c may extend in the x-axis direction between the one end portion (e.g., an end portion in the −y-axis direction) of the first sidewall 214a and the one end portion (e.g., an end portion in the −y-axis direction) of the second sidewall 214b. The fourth sidewall 214d may extend in the x-axis direction between the opposite end portion (e.g., an end portion in the +y-axis direction) of the first sidewall 214a and the opposite end portion (e.g., an end portion in the +y-axis direction) of the second sidewall 214b while being substantially parallel to the third sidewall 214c.

In an embodiment, the microphone hole 219 in fluid communication with the first through-hole 215 may be formed in a partial region of the first sidewall 214a. The microphone hole 219 may penetrate the partial region of the first sidewall 214a in a lateral direction. For example, the microphone hole 219 may penetrate the first sidewall 214a in the +x-axis direction. The microphone hole 219 may be connected with the first through-hole 215 to enable a flow of fluid. At least a portion of the microphone hole 219 may be exposed on the first surface 145 of the back cover 140 as the sidewall portion 214 protrudes from the first surface 145 of the back cover 140. According to an embodiment, sound outside the electronic device (e.g., the electronic device 100 of FIGS. 1 to 4 and 9) may be transmitted to the microphone module 240 through the first through-hole 215 and the microphone hole 219. An operation in which the microphone module 240 receives the external sound through the first through-hole 215 and the microphone hole 219 will be described below in more detail with reference to FIG. 9.

In an embodiment, the camera window 220 may be disposed on the camera cover member 210 so as to face the same direction (e.g., the −z-axis direction) as the first surface 145 of the back cover 140. For example, the camera window 220 may be located in a higher position by a predetermined height in the −z-axis direction than the first surface 145 of the back cover 140. The camera window 220 may be seated on the second seating surface 212 of the camera cover member 210. For example, the camera window 220 may be attached to the second seating surface 212 through the window tape 230. The camera window 220 disposed on the second seating surface 212 may cover at least a portion of the camera module (e.g., the third camera module 194 of FIG. 3) accommodated in the camera cover member 210. For example, the camera window 220 may be disposed to at least partially overlap the camera module 194 when the first surface 145 of the back cover 140 is viewed from above.

In an embodiment, the camera window 220 may include window regions 221 and 223 that correspond to the first openings 217 and/or the second opening 218 formed in the camera cover member 210. The window regions 221 and 223 may include the first window regions 221 corresponding to the plurality of first openings 217 and the second window region 223 corresponding to the second opening 218. According to an embodiment, when the first surface 145 of the back cover 140 is viewed from above, the first window regions 221 may overlap the cameras (e.g., the cameras 194a, 194b, and 194c of FIGS. 10 and 11), and the second window region 223 may overlap the flash (e.g., the flash 194d of FIGS. 10 and 11). External light may be incident on lenses of the cameras 194a, 194b, and 194c through the first window regions 221. Light generated from the flash 194d may be irradiated outside the electronic device 100 through the second window region 223. According to various embodiments of the disclosure, the first window regions 221 and the second window region 223 may be configured to include at least one of a transparent region, a translucent region, or an opaque region. For example, the transparent region may include a material capable of transmitting light, and the opaque region may include a material incapable of transmitting light. Whether or not the opaque region transmits light may be determined based on a wavelength range of light. The opaque region may be formed to transmit only light corresponding to a specified wavelength range. For example, the opaque region may be formed of a material through which infrared rays (IR) pass, but visible light does not pass.

In an embodiment, the window tape 230 may be disposed between the camera window 220 and the camera cover member 210. The window tape 230 may attach the camera window 220 to the camera cover member 210. The window tape 230 may be configured to provide an adhesive force between the camera window 220 and the camera cover member 210. For example, the window tape 230 may include a double-sided tape.

In an embodiment, the window tape 230 may be formed to substantially correspond to the shape of the camera cover member 210. The window tape 230 may include third openings 231 and a fourth opening 233 that correspond to the first openings 217 and the second opening 218 of the camera cover member 210, respectively. For example, the third openings 231 may be formed in a shape corresponding to the first openings 217, and the fourth opening 233 may be formed in a shape corresponding to the second opening 218. The third openings 231 may partially overlap the first openings 217, and the fourth opening 233 may partially overlap the second opening 218. For example, the first window regions 221 may be visually exposed through the first openings 217 and the third openings 231 when the first surface 145 of the back cover 140 is viewed from above. Furthermore, the second window region 223 may be visually exposed through the second opening 218 and the fourth opening 233 when the first surface 145 of the back cover 140 is viewed from above.

In an embodiment, the microphone module 240 may be disposed on a partial region of the camera cover member 210. For example, the microphone module 240 may be attached to the partial region of the camera cover member 210 so as to be located on the second surface 146 of the back cover 140. In an embodiment, the microphone module 240 may include a first circuit board 241 attached to the camera cover member 210 and a microphone 242 disposed on the first circuit board 241.

In an embodiment, the first circuit board 241 may be disposed on at least a partial region (e.g., the microphone region 216) of the camera cover member 210. For example, the first circuit board 241 may be disposed on the first seating surface 211 of the camera cover member 210. The first circuit board 241 may be attached to the microphone region 216 of the first seating surface 211 of the camera cover member 210. For example, the first circuit board 241 may include at least one of a printed circuit board (PCB), a flexible PCB (FPCB), or a rigid-flexible PCB (RFPCB). A configuration for attaching the first circuit board 241 and the camera cover member 210 will be described below with reference to FIGS. 6, 7A, and 7B.

In an embodiment, the microphone 242 may be configured to detect and/or receive sound outside the back cover 140 (or, the housing (e.g., the first housing 110 or the second housing 120 of FIGS. 1 to 4)). The microphone 242 may convert the sound into an electrical signal. The microphone 242 may be disposed on one surface (e.g., a surface facing the +z-axis direction) of the first circuit board 241 so as to be electrically connected with the first circuit board 241. For example, the microphone 242 may include various types of microphones including an electronic condenser microphone (ECM) and a micro electro mechanical system (MEMS) microphone. According to various embodiments of the disclosure, the microphone 242 disposed on the camera cover member 210 may be used for receiving and/or detecting sound related to a photographing operation of the camera module (e.g., the third camera module 194 of FIG. 4) of the electronic device (e.g., the electronic device 100 of FIGS. 1 to 4 and 9). However, the function and/or use of the microphone 242 is not limited to the above-described contents.

Figure 7A:
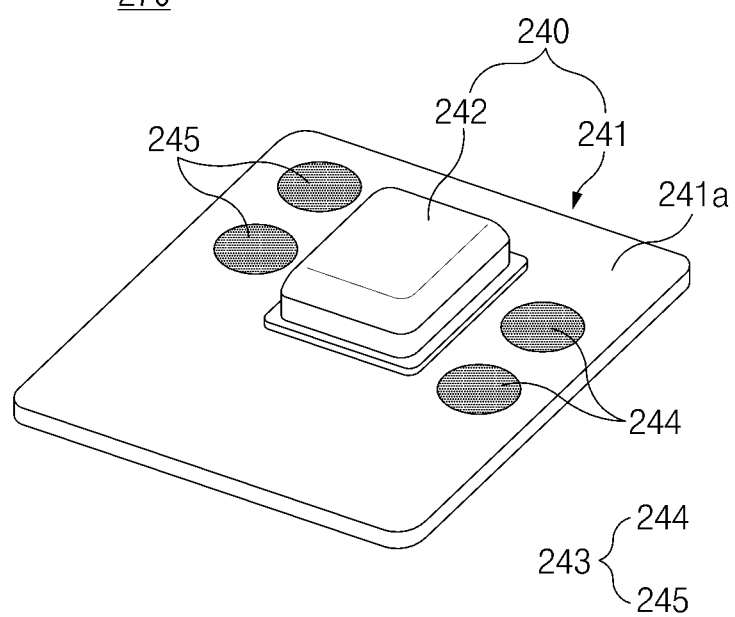
FIG. 7A is a perspective view of a microphone assembly of the electronic device, as viewed in a front direction, according to an embodiment.
Figure 7B:
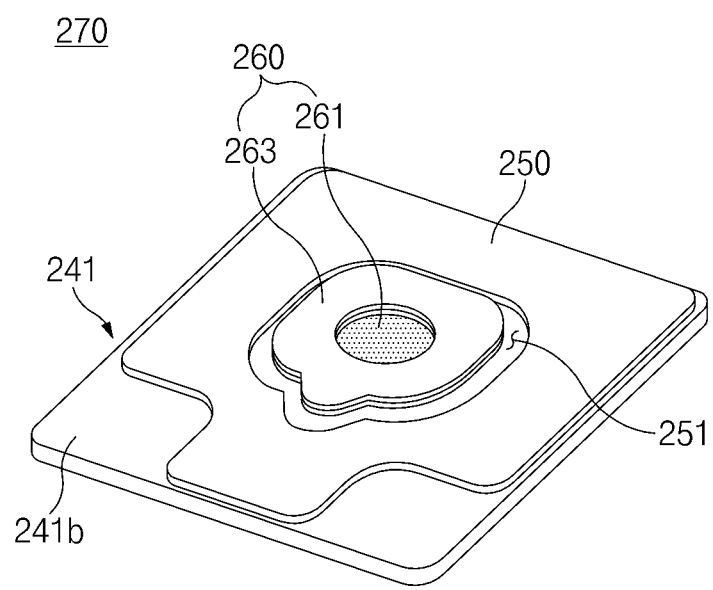
FIG. 7B is a perspective view of the microphone assembly of the electronic device, as viewed in a rear direction, according to an embodiment.
Figure 8:
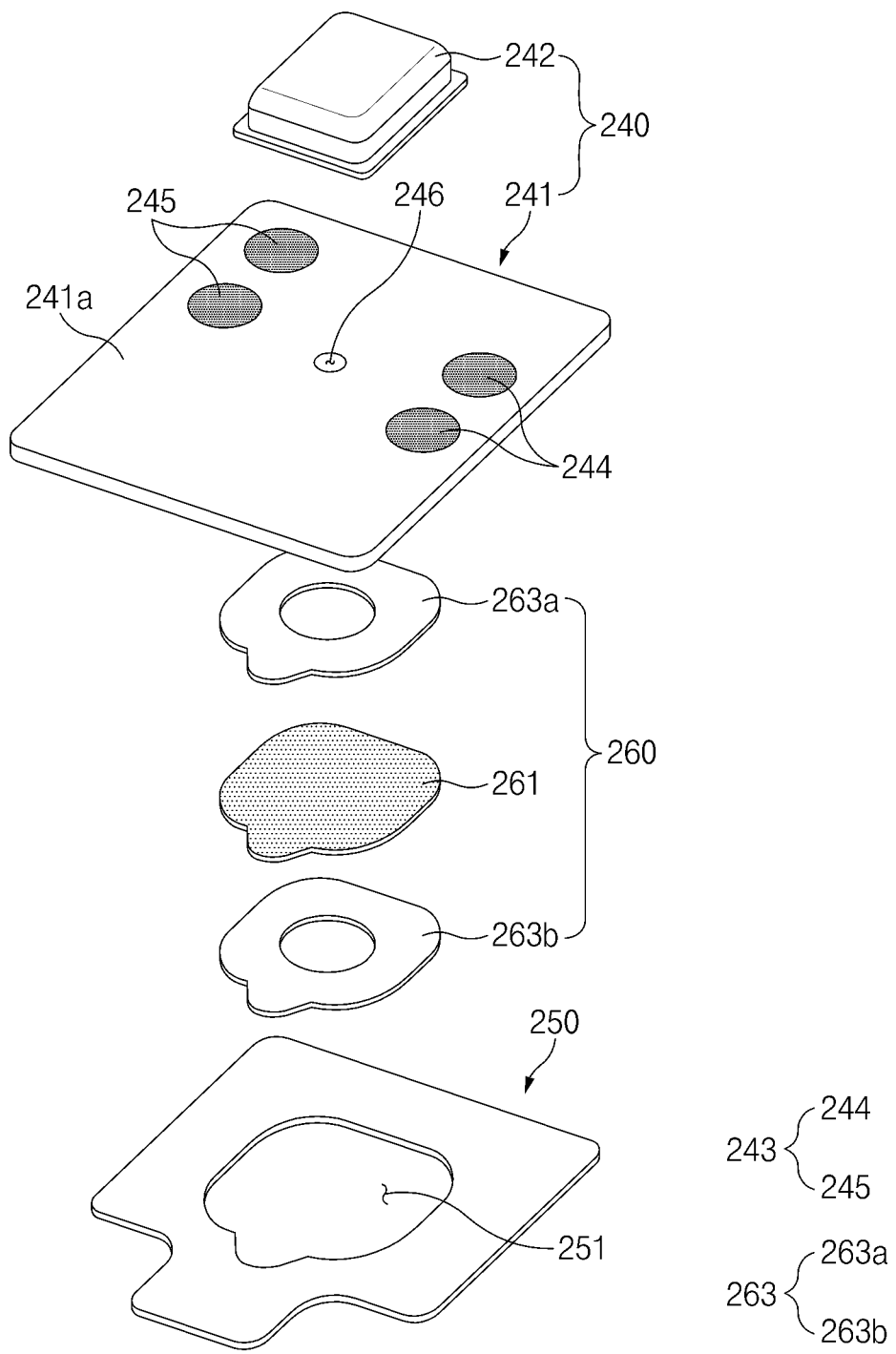
FIG. 8 is an exploded perspective view of the microphone assembly of the electronic device, according to an embodiment.

FIGS. 7A and 7B are perspective views of a microphone assembly of the electronic device, as respectively viewed in front and rear directions, according to an embodiment. FIG. 8 is an exploded perspective view of the microphone assembly of the electronic device, according to an embodiment.

Referring to FIGS. 7A, 7B, and 8, the microphone assembly 270 of the electronic device according to an embodiment (e.g., the electronic device 100 of FIGS. 1 to 4 and 9) may include the microphone module 240, the adhesive member 250, and the waterproof member 260. For example, the microphone assembly 270 may be construed as indicating an assembly formed by attaching the adhesive member 250 and the waterproof member 260 to the microphone module 240. In various embodiments of the disclosure, the adhesive member 250 and the waterproof member 260 are not limited to being provided in the state of being attached to the microphone module 240.

In an embodiment, the microphone module 240 may include the first circuit board 241 disposed on at least a portion of the camera cover member (e.g., the camera cover member 210 of FIGS. 5A, 5B, and 6) and the microphone 242 disposed on the first circuit board 241.

In an embodiment, the first circuit board 241 may include a first surface 241a on which the microphone 242 is disposed and a second surface 241b that faces away from the first surface 241a and on which the adhesive member 250 and the waterproof member 260 are disposed. A third through-hole 246 penetrating from the first surface 241a to the second surface 241b may be formed in at least a portion of the first circuit board 241. For example, the microphone 242 may be disposed on the first circuit board 241 to overlap the third through-hole 246. The third through-hole 246 may provide a path along which sound travels to the microphone 242.

In an embodiment, the first circuit board 241 may include a contact region 243. The contact region 243 may electrically connect the first circuit board 241 and the second circuit board (e.g., the first substrate 170-1 of the second circuit board 170 of FIG. 4). For example, the contact region 243 may make contact with at least a portion (e.g., a contact structure 173 of FIGS. 9 to 11) of the second circuit board 170 of the electronic device 100. The first circuit board 241 may be electrically connected with the second circuit board 170 through a contact structure between the contact region 243 and the second circuit board 170. For example, the contact region 243 may at least partially include a conductive material for electrical connection. According to various embodiments of the disclosure, the first circuit board 241 may be configured to be supported by the second circuit board 170 as the contact region 243 makes contact with the second circuit board 170. The contact structure of the contact region 243 and the second circuit board 170 will be described below in more detail with reference to FIGS. 9 to 12.

In an embodiment, the contact region 243 may be formed on the first surface 241a of the first circuit board 241. The contact region 243 may be disposed on opposite sides of the microphone 242 on the first surface 241a. The contact region 243 may be constituted by a plurality of regions, and the contact regions 243 may be disposed on the opposite sides of the microphone 242. For example, the contact regions 243 may include a first contact region 244 disposed on one side of the microphone 242 (e.g., disposed in the +x-axis direction with respect to the microphone 242) and a second contact region disposed on an opposite side of the microphone 242 (e.g., disposed in the −x-axis direction with respect to the microphone 242). The distances by which the first contact region 244 and the second contact region 245 are spaced apart from the microphone 242 in the opposite directions (e.g., the +x/−x-axis directions) may be the same as each other. Accordingly, in a state in which the contact regions 243 are brought into contact with a part of structures of the second circuit board 170 (e.g., the contact structure 173 of FIGS. 9 to 11), the microphone module 240 may be stably supported (e.g., refer to FIGS. 10 and 11). According to the illustrated embodiment, each of the first contact region 244 and the second contact region 245 may include two regions. However, the disclosure is not limited to the illustrated embodiment, and according to various embodiments of the disclosure, the numbers of first contact regions 244 and second contact regions 245 may be changed.

In an embodiment, the microphone 242 may be disposed on the first surface 241a of the first circuit board 241. The microphone 242 may be disposed to overlap the third through-hole 246. For example, the third through-hole 246 may be hidden by the microphone 242 when the first surface 241a of the first circuit board 241 is viewed from above. The microphone 242 may be at least partially in fluid communication with the third through-hole 246 and may receive sound through the third through-hole 246. The microphone 242 may be electrically connected with the first circuit board 241. For example, the microphone 242 may be surface mounted on the first surface 241a of the first circuit board 241 (e.g., surface mount technology (SMT) or surface mount device (SMD)).

In an embodiment, the adhesive member 250 may be attached to the second surface 241b of the first circuit board 241. The adhesive member 250 may be configured to provide an adhesive force to both surfaces. For example, one surface of the adhesive member 250 may be attached to the second surface 241b of the first circuit board 241, and an opposite surface of the adhesive member 250 may be attached to the camera cover member (e.g., the camera cover member 210 of FIGS. 5A, 5B, and 6). Accordingly, the adhesive member 250 may attach the first circuit board 241 to the camera cover member 210. For example, the adhesive member 250 may include a double-sided tape.

In an embodiment, the adhesive member 250 may include a second through-hole 251. The waterproof member 260 may be disposed in the second through-hole 251. For example, the adhesive member 250 may surround the periphery of the waterproof member 260 as the waterproof member 260 is disposed in the second through-hole 251. According to various embodiments of the disclosure, the second through-hole 251 may be formed in a shape corresponding to the waterproof member 260 and may be formed to be larger than the waterproof member 260. However, the shape and/or size of the second through-hole 251 is not limited to the illustrated embodiment.

In an embodiment, the waterproof member 260 may be disposed on the second surface 241b of the first circuit board 241. For example, the waterproof member 260 may be attached to the second surface 241b so as to be located in the second through-hole 251 of the adhesive member 250. The waterproof member 260 may be disposed to overlap the third through-hole 246. For example, the third through-hole 246 may be hidden by the waterproof member 260 when the second surface 241b of the first circuit board 241 is viewed from above. The waterproof member 260 may prevent water from passing through the third through-hole 246. The waterproof member 260 may be implemented using a material through which water does not pass, but sound (or, air) passes. For example, the waterproof member 260 may include a waterproof sound-transmitting sheet.

In an embodiment, the waterproof member 260 may include a waterproof layer 261 including a waterproof material and adhesive layers 263 that are disposed on opposite surfaces of the waterproof layer 261 and that include an adhesive material. The adhesive layers 263 may be disposed on the opposite surfaces of the waterproof layer 261 and may be attached to a peripheral portion of the waterproof layer 261. For example, a central portion of the waterproof layer 261 might not be attached with the adhesive layers 263 due to open regions of the adhesive layers 263. When the waterproof member 260 is attached to the second surface 241b, the third through-hole 246 may be hidden by the central portion of the waterproof layer 261.

In an embodiment, the adhesive layers 263 may include a first adhesive layer 263a attached to one surface of the waterproof layer 261 and a second adhesive layer 263b attached to an opposite surface of the waterproof layer 261. For example, the first adhesive layer 263a and the second adhesive layer 263b may be disposed to face each other with the waterproof layer 261 therebetween. The first adhesive layer 263a and the second adhesive layer 263b may be configured to provide an adhesive force to both surfaces. For example, the first adhesive layer 263a may provide an adhesive force between the one surface of the waterproof layer 261 and the second surface 241b of the first circuit board 241. The second adhesive layer 263b may provide an adhesive force between the opposite surface of the waterproof layer 261 and the camera cover member (e.g., the camera cover member 210 of FIGS. 5A, 5B, and 6).

Figure 9:
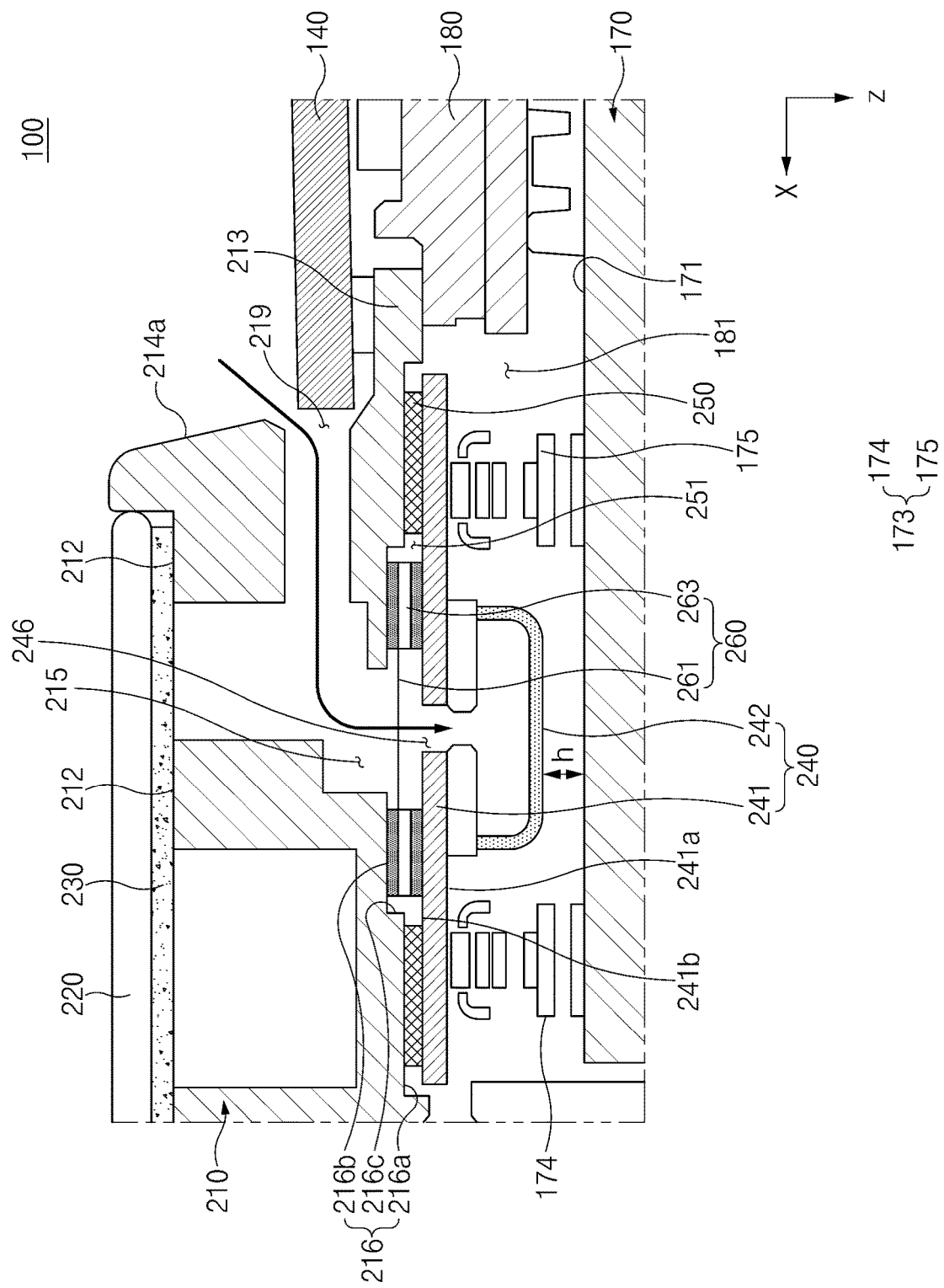
FIG. 9 is a sectional view of a portion of the electronic device, according to an embodiment.

FIG. 9 is a sectional view of a portion of the electronic device, taken along line A-A' of FIG. 1, according to an embodiment.

Referring to FIG. 9, the electronic device 100 according to an embodiment may include the back cover 140 (e.g., the first back cover 140-1 of FIG. 4), the second circuit board 170 (e.g., the first substrate 170-1 of FIG. 4), the support member 180 (e.g., the first support member 180-1 of FIG. 4), the camera cover member 210, the camera window 220, the window tape 230, the microphone module 240, the adhesive member 250, and the waterproof member 260. Some of the components of the electronic device 100 illustrated in FIG. 9 may be identical or similar to the components of the electronic device 100 illustrated in FIGS. 1 to 8, and repetitive descriptions will hereinafter be omitted.

In an embodiment, the back cover 140 may form at least a portion of an outer surface (e.g., the rear surface) of the electronic device 100. For example, the back cover 140 may be configured to form the housing of the electronic device 100 (e.g., the housings 110 and 120 of FIGS. 1 to 4) together with the side members (e.g., the side members 113 and 123 of FIGS. 1 to 4) and the support plate (e.g., the support plate 130 of FIGS. 3 and 4). The back cover 140 may include the open region (e.g., the open region 147 of FIG. 6) in which at least a portion of the camera cover member 210 is accommodated, and the camera cover member 210 may protrude outside the housings 110 and 120 through the open region 147. The back cover 140 may be attached with the camera cover member 210 through an adhesive means. For example, the back cover 140 may be attached with the peripheral portion 213 of the camera cover member 210.

In an embodiment, the camera cover member 210 may be disposed in the housing (e.g., the housings 110 and 120 of FIGS. 1 to 4) to protrude from the back cover 140. For example, one portion of the camera cover member 210 may be located in the housings 110 and 120, and another portion of the camera cover member 210 may protrude from the back cover 140 and may be located outside the housings 110 and 120.

In an embodiment, the camera cover member 210 may include the microphone hole 219 in fluid communication with the outside of the electronic device 100. The microphone hole 219 may be formed in the first sidewall 214a of the camera cover member 210. The microphone hole 219 may penetrate a partial region of the first sidewall 214a in the +x-axis direction. According to an embodiment, at least a portion of the microphone hole 219 may be exposed outside the electronic device 100 as the first sidewall 214a protrudes from the back cover 140 by a predetermined height. For example, at least a portion of the microphone hole 219 may be configured to be in fluid communication with the outside of the electronic device 100 through the space between the first sidewall 214a and the back cover 140. Air outside the electronic device 100 may be introduced into the camera cover member 210 through the microphone hole 219.

In an embodiment, the camera cover member 210 may include the first seating surface (e.g., the first seating surface 211 of FIG. 6) including the microphone region 216 and the second seating surface 212 facing away from the first seating surface 211. For example, the first seating surface 211 may mean a surface that faces the second circuit board 170 and faces the +z-axis direction, and the second seating surface 212 may mean a surface facing the −z-axis direction. The microphone module 240, the adhesive member 250, and the waterproof member 260 may be disposed on the microphone region 216. The window tape 230 and the camera window 220 may be disposed on the second seating surface 212. According to an embodiment, the second seating surface 212 may be located in a higher position in the −z-axis direction than the back cover 140.

In an embodiment, the microphone region 216 may include a first region 216a and a second region 216b connected from the first region 216a with a step. For example, a step 216c may be formed between the first region 216a and the second region 216b. The second region 216b may be connected from the first region 216a with a step in the −z-axis direction by the step 216c. For example, the second region 216b may include a region recessed from the first region 216a toward the second seating surface 212. The adhesive member 250 may be attached to the first region 216a, and the waterproof member 260 may be attached to the second region 216b.

In an embodiment, the microphone module 240 may be attached to the microphone region 216 of the camera cover member 210 such that microphone 242 faces the second circuit board 170. For example, the adhesive member 250 may be attached between the second surface 241b of the first circuit board 241 and the first region 216a, and the waterproof member 260 may be attached between the second surface 241b of the first circuit board 241 and the second region 216b. Accordingly, the microphone module 240 may be fixed to the microphone region 216.

In an embodiment, the microphone 242 may receive sound through the third through-hole 246 formed in the first circuit board 241. The third through-hole 246 may be in fluid communication with the first through-hole 215. The third through-hole 246 may be aligned to face the first through-hole 215 in the z-axis direction. For example, the third through-hole 246 may overlap the first through-hole 215 when the first surface 241a of the first circuit board 241 is viewed from above.

In an embodiment, the adhesive member 250 may be disposed between the camera cover member 210 and the first circuit board 241. The adhesive member 250 may provide an adhesive force between the first region 216a of the microphone region 216 and the second surface 241b of the first circuit board 241. The adhesive member 250 may include the second through-hole 251. The second through-hole 251 may be at least partially in fluid communication with the second through-hole 251. According to an embodiment, the second through-hole 251 may be formed to be larger than the first through-hole 215. The second through-hole 251 may be aligned to face the first through-hole 215 in the z-axis direction. For example, the first through-hole 215 may overlap the second through-hole 251 when the first surface 241a of the first circuit board 241 is viewed from above.

In an embodiment, the adhesive member 250 may be disposed between the camera cover member 210 and the first circuit board 241 to surround the third through-hole 246 formed in the first circuit board 241. The adhesive member 250 may be pressed between the second surface 241b of the first circuit board 241 and the first region 216a of the camera cover member 210 such that the first circuit board 241 and the camera cover member 210 are brought into close contact with each other. For example, the adhesive member 250 may perform a function of sealing the space between the first circuit board 241 and the camera cover member 210. Accordingly, a phenomenon in which sound passing through the first through-hole 215 is lost toward a region around the microphone 242 may be prevented, and a sound-receiving effect of the microphone 242 may be improved.

In an embodiment, the waterproof member 260 may be disposed between the second region 216b of the camera cover member 210 and the second surface 241b of the first circuit board 241. The waterproof member 260 may be disposed in the second through-hole 251 to cover the first through-hole 215. For example, the waterproof member 260 may be surrounded by the adhesive member 250 when the second surface 241b of the first circuit board 241 is viewed from above. Between the first through-hole 215 and the third through-246, the waterproof member 260 may block a movement path of water, thereby preventing the microphone module 240 from being inundated by water introduced from outside the electronic device 100.

In an embodiment, the waterproof member 260 may include the waterproof layer 261 and the adhesive layers 263. The adhesive layers 263 may provide an adhesive force between the second region 216b of the camera cover member 210 and the waterproof layer 261 and between the second surface 241b of the first circuit board 241 and the waterproof layer 261. The waterproof layer 261 may be spaced apart from the second surface 241b of the first circuit board 241 by a predetermined gap. For example, the second surface 241b of the first circuit board 241 may make contact with the adhesive member 250 and the adhesive layers 263 and may be spaced apart from the waterproof layer 261 by a predetermined gap. The gap between the waterproof layer 261 and the first circuit board 241 may provide a space in which at least a portion of the waterproof layer 261 is deformable in a direction toward the first circuit board 241 when predetermined pressure is applied to the waterproof layer 261 by water introduced from outside the electronic device 100.

In an embodiment, the second circuit board 170 may be disposed to face the camera cover member 210 with the microphone module 240 therebetween. For example, at least a portion of a third surface 171 of the second circuit board 170 may face the first surface 241a of the first circuit board 241. The first circuit board 241 and the second circuit board 170 may be electrically connected. For example, the microphone module 240 may be configured such that a signal related to an operation of the microphone 242 is transmitted and/or received between the microphone 242 and the second circuit board 170 through the electrical connection between the first circuit board 241 and the second circuit board 170.

In an embodiment, the second circuit board 170 may include the contact structure 173 for electrical connection with the first circuit board 241. The contact structure 173 may be disposed on the third surface 171 of the second circuit board 170. For example, the contact structure 173 may be configured in a structure protruding from the third surface 171 of the second circuit board 170 toward the first surface 241a of the first circuit board 241. The contact structure 173 may make contact with a conductive region (e.g., the contact regions 243 of FIGS. 7A and 8) formed on the first circuit board 241. The contact structure 173 may be electrically connected with the second circuit board 170, and the first circuit board 241 may be electrically connected with the second circuit board 170 through contact between the contact structure 173 and the conductive region of the first circuit board 241. For example, the contact structure 173 may be surface mounted on the third surface 171 of the second circuit board 170. The contact structure 173 may include a C-clip.

In an embodiment, the contact structure 173 may provide a support structure of the microphone module 240 (e.g., the first circuit board 241) while providing an electrical contact structure of the first circuit board 241 and the second circuit board 170. The contact structure 173 may include a first contact structure 174 and a second contact structure 175. For example, the first contact structure 174 may be disposed in the +x-axis direction with respect to the microphone 242, and the second contact structure 175 may be disposed in the −x-axis direction with respect to the microphone 242. The first contact structure 174 and the second contact structure 175 may be configured to correspond to the conductive region of the first circuit board 241 (e.g., the contact regions 243 of FIGS. 7A and 8).

In an embodiment, the first contact structure 174 and the second contact structure 175 may be configured to make contact with a conductive region formed on the first surface 241a of the first circuit board 241 (e.g., the contact regions 243 of FIGS. 7A and 8). For example, the conductive region of the first circuit board 241 may be formed to be located on opposite sides of the microphone 242 (e.g., the first contact region 244 and the second contact region 245 of FIGS. 7A and 8). Accordingly, when the first circuit board 241 is supported by the contact structure 173, the microphone 242 may be located between the first contact structure 174 and the second contact structure 175. According to various embodiments of the disclosure, the first contact structure 174 and the second contact structure 175 may be disposed in positions symmetrical to each other with respect to the microphone 242. For example, the distances by which the first contact structure 174 and the second contact structure 175 are spaced apart from the microphone 242 in the x-axis direction may be substantially the same as each other. According to an embodiment, the microphone module 240 may be stably fixed between the camera cover member 210 and the second circuit board 170 as the opposite sides of the first circuit board 241 are supported by the contact structure 173. The support structure of the microphone module 240 using the contact structure 173 will be described below in more detail with reference to FIGS. 10 and 11.

In an embodiment, the support member 180 may be disposed between the second circuit board 170 and the back cover 140. The support member 180 may be disposed on the third surface 171 of the second circuit board 170 and may support at least a portion of the back cover 140. For example, the back cover 140 and the second circuit board 170 may face each other with the support member 180 therebetween. The support member 180 may support at least a portion of the camera cover member 210. For example, the support member 180 may support the peripheral portion 213 of the camera cover member 210. The peripheral portion 213 of the camera cover member 210 may be disposed between the back cover 140 and the support member 180.

In an embodiment, the support member 180 may include the open region 181. For example, the open region 181 of the support member 180 may mean a space that is open such that the camera cover member 210 and the microphone module 240 face the third surface 171 of the second circuit board 170. The microphone module 240 may face the third surface 171 of the second circuit board 170 through the open region 181 of the support member 180 and may be supported by the contact structure 173. For example, when the third surface 171 of the second circuit board 170 is viewed from above (e.g., when the third surface 171 of the second circuit board 170 is viewed in the +z-axis direction), the microphone module 240 may be located in the open region 181 of the support member 180 and thus might not overlap the support member 180. The microphone module 240 may be supported by the contact structure 173 of the second circuit board 170 without being brought into contact with the support member 180. The electronic device 100 according to an embodiment may be configured such that the support member 180 is not located between the microphone module 240 and the second circuit board 170, and thus the microphone module 240 and the second circuit board 170 may be disposed closer to each other in the z-axis direction than when the microphone module 240 is supported by the support member 180.

The electronic device 100 according to an embodiment of the disclosure may be configured such that the first through-hole 215, the microphone hole 219, and the third through-hole 246 are in fluid communication with one another. For example, sound outside the electronic device 100 may be introduced into a conduit inside the camera cover member 210 through the microphone hole 219, and the external sound introduced into the conduit of the camera cover member 210 may pass through the first through-hole 215 and the third through-hole 246 and may move to the microphone 242. According to an embodiment, the adhesive member 250 disposed between the first region 216a and the first circuit board 241 may prevent the external sound from being lost around the microphone 242.

The electronic device 100 according to an embodiment of the disclosure may include the microphone module 240 disposed adjacent to the microphone hole 219, and the microphone module 240 may be electrically connected and supported with the second circuit board 170 through the contact structure 173. Due to this, the path along which sound introduced from outside the electronic device 100 moves to the microphone 242 may be shortened, and a stacked structure in which the adhesive member 250 and the waterproof member 260 are disposed on substantially the same plane may be implemented. Accordingly, the sound quality of the electronic device 100 may be improved, and it may be advantageous for uniformly maintaining the quality of the electronic device 100.

Furthermore, in the electronic device 100 according to an embodiment of the disclosure, the microphone module 240 may be supported through the contact structure 173 of the second circuit board 170. The contact structure 173 may be disposed to surround the microphone 242. Accordingly, a separate structure (e.g., a portion of the support member 180) for supporting the microphone module 240 between the microphone module 240 and the second circuit board 170 may be omitted, and a stable support structure of the microphone module 240 may be implemented. Thus, the microphone module 240 may be mounted so as to be located close to the second circuit board 170 and may provide an advantage in designing the electronic device 100 to be thin.

Moreover, in the electronic device 100 according to an embodiment of the disclosure, the microphone hole 219 may be formed in a lateral direction of the camera cover member 210 by decreasing the mounting height h of the microphone module 240 based on the second circuit board 170. Accordingly, a hole need not be formed in the camera window 220 exposed on the rear surface of the electronic device 100, and thus various designs may be possible in terms of the design of the electronic device 100. In addition, a protector, such as a mesh member or a grill, may be omitted between the camera window 220 and the camera cover member 210.

Figure 10:
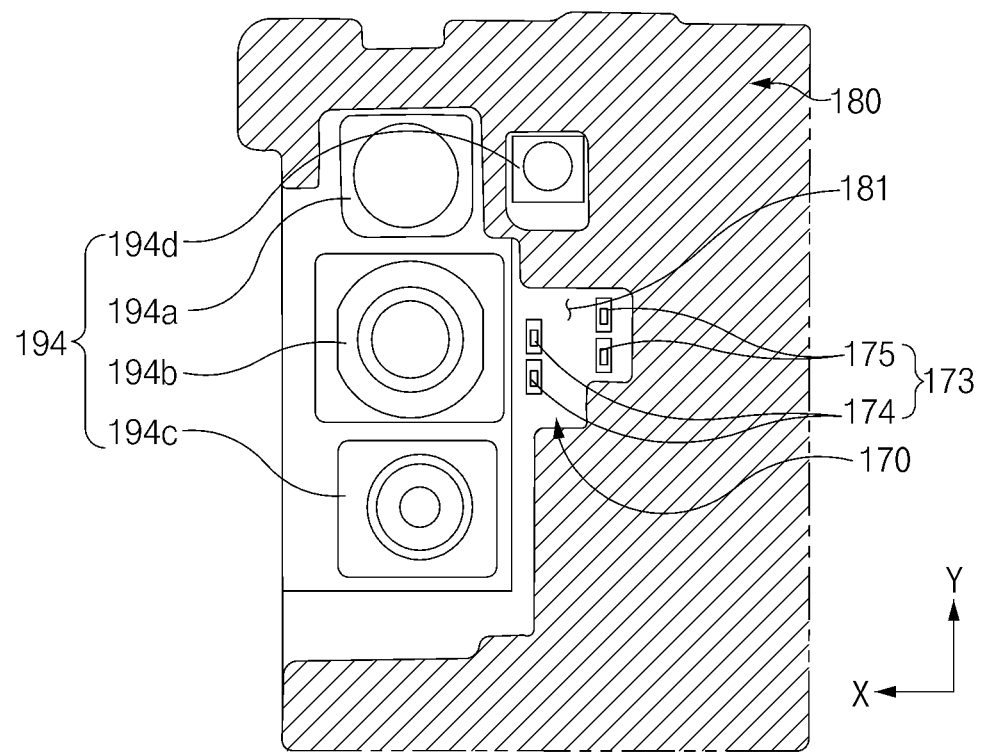
FIG. 10 is an orthogonal view illustrating a second circuit board and a support member of the electronic device, according to an embodiment.
Figure 11:
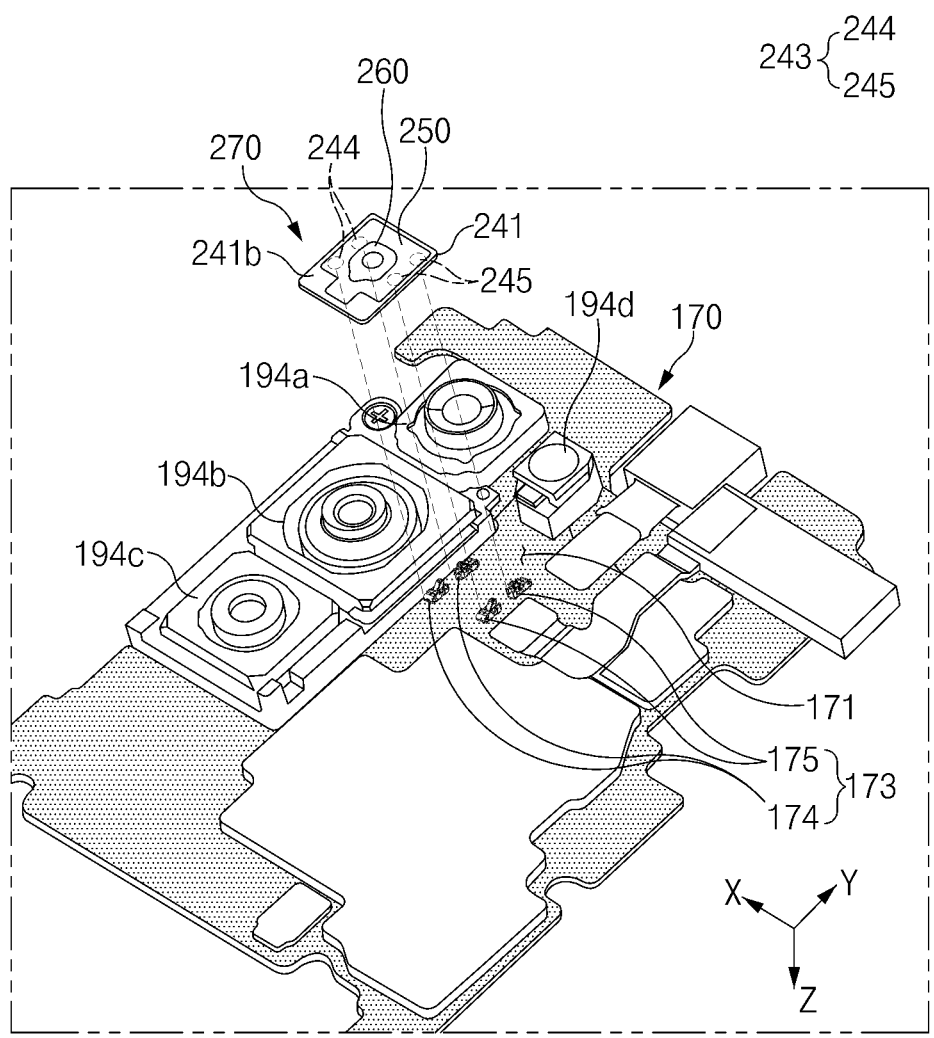
FIG. 11 is a perspective view illustrating a support structure between the microphone assembly and the second circuit board of the electronic device, according to an embodiment.

FIG. 10 is an view illustrating the second circuit board and the support member of the electronic device, according to an embodiment. FIG. 11 is a perspective view illustrating a support structure between the microphone assembly and the second circuit board, of the electronic device according to an embodiment.

Referring to FIGS. 10 and 11, the electronic device according to an embodiment (e.g., the electronic device 100 of FIGS. 1 to 4 and 9) may include the second circuit board 170 (e.g., the first substrate 170-1 of FIG. 4), the support member 180 (e.g., the first support member 180-1 of FIG. 4), and the microphone assembly 270. Some of the components of the electronic device 100 illustrated in FIGS. 10 and 11 may be identical or similar to the components of the electronic device 100 illustrated in FIGS. 1 to 9, and repetitive descriptions will hereinafter be omitted.

In an embodiment, the second circuit board 170 may include the contact structure 173. For example, the contact structure 173 may be disposed on the third surface 171 of the second circuit board 170 to face the contact regions 243 of the first circuit board 241. According to an embodiment, the contact structure 173 may be brought into contact with the first circuit board 241 of the microphone assembly 270 to support the first circuit board 241 and electrically connect the second circuit board 170 and the first circuit board 241. For example, the contact structure 173 may be electrically connected to the second circuit board 170 and may include a conductive material. According to the illustrated embodiment, the contact structure 173 may include a C-clip. However, the disclosure is not limited to the illustrated embodiment, and according to various embodiments of the disclosure, the contact structure 173 may be implemented in another form (e.g., a pogo-pin).

In an embodiment, the support member 180 may be disposed on the third surface 171 of the second circuit board 170 to surround at least a part of the camera module 194 (e.g., the first camera 194a, the second camera 194b, the third camera 194c, and/or the flash 194d). For example, the camera module 194 may be disposed on the third surface 171 of the second circuit board 170, and the support member 180 may be disposed on the third surface 171 of the second circuit board 170 to surround the camera module 194.

In an embodiment, the support member 180 may include the open region 181 (e.g., the open region 181 of FIGS. 4 and 9). The open region 181 may be formed to surround the camera module 194 and the contact structure 173 when the support member 180 is disposed on the third surface 171 of the second circuit board 170. For example, when the support member 180 is viewed from above (e.g., when the support member 180 is viewed in the +z-axis direction), the camera module 194 and the contact structure 173 may be visually exposed through the open region 181 in the state in which the support member 180 is disposed on the third surface 171 of the second circuit board 170. According to an embodiment, the camera module 194 and the contact structure 173 may face the camera cover member (e.g., the camera cover member 210 of FIGS. 5A, 5B, 6, and 9) through the open region 181 of the support member 180 when the support member 180 is disposed between the back cover (e.g., the back cover 140 of FIGS. 4 to 6 and 9) and the second circuit board 170 (e.g., refer to FIGS. 4 and 9). For example, the back cover 140 may be the first back cover (e.g., the first back cover 140-1 of FIGS. 1, 2, and 4).

In an embodiment, through contact with the contact structure 173, the microphone assembly 270 may be supported by the second circuit board 170 while being electrically connected with the second circuit board 170. For example, the first circuit board 241 may include a contact region (e.g., the first contact region 244 and the second contact region 245) brought into contact with the contact structure 173. The contact region 243 may be formed in a position corresponding to the contact structure 173.

In an embodiment, the microphone assembly 270 may be disposed to face the third surface 171 of the second circuit board 170. The microphone assembly 270 may be attached to the back cover (e.g., the back cover 140 of FIGS. 4 to 6 and 9) through the adhesive member 250 and the waterproof member 260. The back cover 140 may be coupled to face the second circuit board 170 with the support member 180 therebetween (e.g., refer to FIGS. 4 and 9). The microphone assembly 270 may be disposed to face the third surface 171 of the second circuit board 170 and the contact structure 173 through the open region 181 of the support member 180 in the state of being attached to the back cover 140.

In an embodiment, the first contact region 244 may be brought into contact with the first contact structure 174, and the second contact region 245 may be brought into contact with the second contact structure 175. The first contact region 244 and the second contact region 245 may be formed on the opposite sides of the microphone (e.g., the microphone 242 of FIGS. 5A to 9) (e.g., refer to FIGS. 7A and 7B). According to an embodiment, the microphone 242 may be surrounded by the first contact structure 174 and the second contact structure 175 as the first contact region 244 and the second contact region 245 make contact with the first contact structure 174 and the second contact structure 175. Accordingly, the microphone assembly 270 may be stably supported. Various embodiments of a form in which the contact structure 173 surrounds the microphone 242 will be described below with reference to FIGS. 12A to 12D.

The electronic device 100 according to an embodiment of the disclosure may be configured such that the first circuit board 241 of the microphone assembly 270 is brought into contact with the contact structure 173 of the second circuit board 170 without being supported by other structures. For example, the support member 180 may be configured so as not to be located between the first circuit board 241 and the second circuit board 170 through the open region 181. Accordingly, the electronic device 100 may simultaneously implement an electrical contact structure and a support structure of the first circuit board 241 using the contact structure 173.

FIGS. 12A, 12B, 12C, and 12D are views illustrating states in which the microphone module of the electronic device is supported by the contact structure, according to various embodiments. These views more specifically illustrate various different arrangements of the positions of the contact region and the contact structure with respect to the microphone when the microphone module is supported by the contact structure.

Referring to FIGS. 12A, 12B, 12C, and 12D, the electronic device according to an embodiment (e.g., the electronic device 100 of FIGS. 1 to 4 and 9) may include a support structure of the microphone module 240 by the contact structure (e.g., the contact structure 173 of FIGS. 9 to 11). Some of the components of the electronic device 100 illustrated in FIGS. 12A, 12B, 12C, and 12D may be identical or similar to the components of the electronic device 100 illustrated in FIGS. 1 to 11, and repetitive descriptions will hereinafter be omitted.

In an embodiment, the microphone module 240 may include the first contact region 244 and the second contact region 245 that are disposed on the first circuit board 241. The first contact region 244 and the second contact region 245 may be brought into contact with the first contact structure 174 and the second contact structure 175 that are disposed on the second circuit board (e.g., the second circuit board 170 of FIGS. 9 to 11). According to the illustrated embodiment, the microphone module 240 may be supported by the first contact structure 174 and the second contact structure 175 as the first contact structure 174 and the second contact structure 175 are brought into contact with the first contact region 244 and the second contact region 245 on the opposite sides of the microphone 242.

In an embodiment, the first contact region 244 and the second contact region 245 may be formed to surround at least a portion of the microphone 242 on the first circuit board 241. For example, the first contact region 244 may include a first conductive region 244a and a second conductive region 244b. The second contact region 245 may include a third conductive region 245a and a fourth conductive region 245b. The first contact structure 174 may include a first conductive structure 174a making contact with the first conductive region 244a and a second conductive structure 174b making contact with the second conductive region 244b. The second contact structure 175 may include a third conductive structure 175a making contact with the third conductive region 245a and a fourth conductive structure 175b making contact with the fourth conductive region 245b.

Figure 12A:
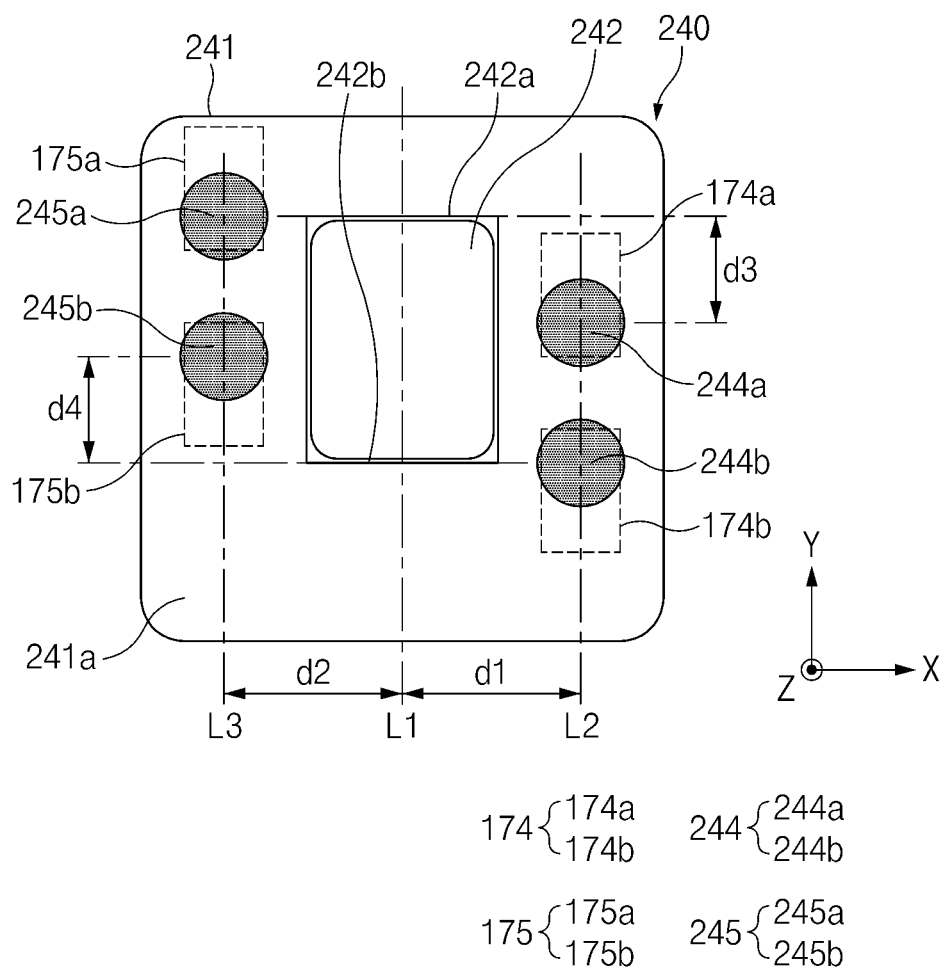
FIGS. 12A, 12B, 12C, and 12D are views illustrating states in which a microphone module of the electronic device is supported by a contact structure, according to various embodiments.
Figure 12B:
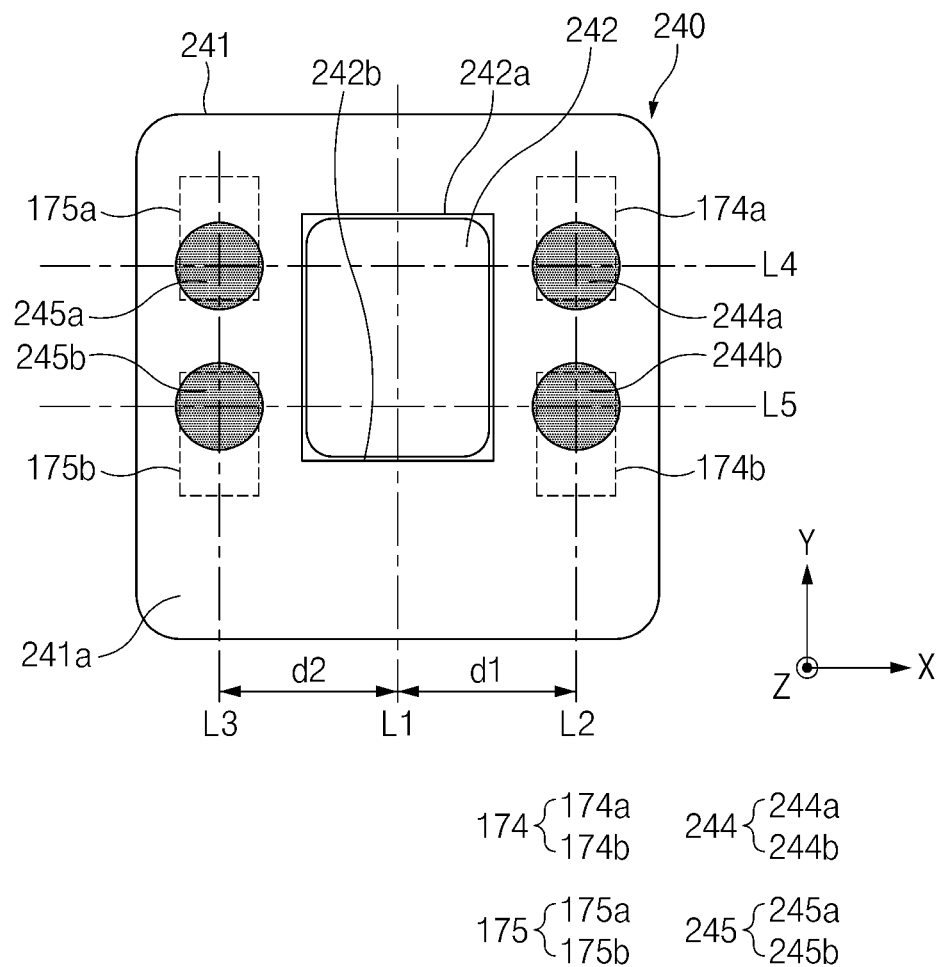
Figure 12C:
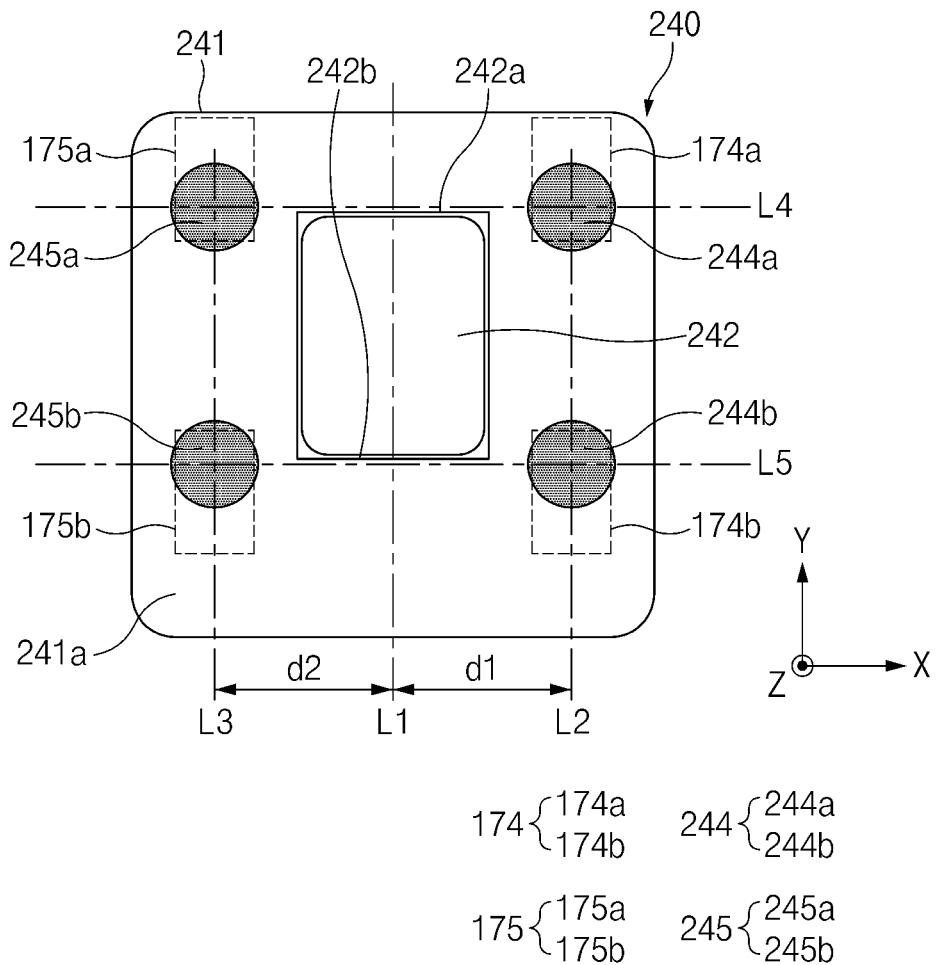

According to the embodiments illustrated in FIGS. 12A, 12B, and 12C, the first conductive region 244a and the second conductive region 244b may be disposed on one side of the microphone 242 (e.g., the +x-axis direction). The third conductive region 245a and the fourth conductive region 245b may be disposed on an opposite side of the microphone 242 (e.g., the −x-axis direction). For example, the first conductive structure 174a and the second conductive structure 174b may be disposed on one surface (e.g., the third surface 171 of FIGS. 9 to 11) of the second circuit board (e.g., the second circuit board 170 of FIGS. 9 to 11) so as to make contact with the first conductive region 244a and the second conductive region 244b on the one side of the microphone 242 (e.g., the +x-axis direction). Furthermore, the third conductive structure 175a and the fourth conductive structure 175b may be disposed on the one surface of the second circuit board 170 so as to make contact with the third conductive region 245a and the fourth conductive region 245b on the opposite side of the microphone 242 (e.g., the −x-axis direction). However, the number of conductive regions included in the first contact region 244 and the second contact region 245 and/or the number of conductive structures included in the first contact structure 174 and the second contact structure 175 are illustrative and are not limited to the illustrated embodiments.

In an embodiment, the first conductive region 244a and the second conductive region 244b may be located on substantially the same line on the one side of the microphone 242 (e.g., the +x-axis direction). Furthermore, the third conductive region 245a and the fourth conductive region 245b may be located on substantially the same line on the opposite side of the microphone 242 (e.g., the −x-axis direction). For example, a first virtual reference line L1 passing through the center of the microphone 242 and substantially parallel to the y-axis, and a second virtual reference line L2 and a third virtual reference line L3 that are substantially parallel to the first reference line L1 may be defined. The first conductive region 244a and the second conductive region 244b may be located on the second reference line L2 formed in the +x-axis direction from the first reference line L1, and the third conductive region 245a and the fourth conductive region 245b may be located on the third reference line L3 formed in the −x-axis direction from the first reference line L1.

In an embodiment, the distance d1 by which the first conductive region 244a and the second conductive region 244b are spaced apart from the microphone 242 in the +x-axis direction may be substantially the same as the distance d2 by which the third conductive region 245a and the fourth conductive region 245b are spaced apart from the microphone 242 in the −x-axis direction. For example, the first distance d1 between the first reference line L1 and the second reference line L2 may be substantially the same as the second distance d2 between the first reference line L1 and the third reference line L3. However, the disclosure is not necessarily limited to the illustrated embodiments, and according to various embodiments of the disclosure, the positions of the first contact region 244 and the second contact region 245 may be changed. For example, the distance between the first reference line L1 and the second reference line L2 and the distance between the first reference line L1 and the third reference line L3 may differ from each other. Furthermore, the first conductive region 244a and the second conductive region 244b need not be located on substantially the same line, or the third conductive region 245a and the fourth conductive region 245b need not be located on substantially the same line.

According to an embodiment, the first conductive region 244a and the third conductive region 245a may be located on the same line (FIGS. 12B and 12C), or may be staggered with respect to each other (FIG. 12A). Furthermore, the second conductive region 244b and the fourth conductive region 245b may be located on the same line (FIGS. 12B and 12C), or may be staggered with respect to each other (FIG. 12A).

As illustrated in FIG. 12A, the first conductive region 244a and the third conductive region 245a may be located to have a specified height difference in the y-axis direction. Likewise, the second conductive region 244b and the fourth conductive region 245b may be located to have a specified height difference in the y-axis direction. For example, the first conductive region 244a and the third conductive region 245a may be spaced apart from each other by a third distance d3 in the y-axis direction, and the second conductive region 244b and the fourth conductive region 245b may be spaced apart from each other by a fourth distance d4 in the y-axis direction. According to the illustrated embodiment, the third conductive region 245a may be located in a higher position in the +y-axis direction than a first side surface 242a of the microphone 242 when the first surface 241a of the first circuit board 241 is viewed from above, and the second conductive region 244b may be located in a higher position in the −y-axis direction than a second side surface 242b of the microphone 242 when the first surface 241a of the first circuit board 241 is viewed from above. Accordingly, when the second conductive structure 174b is brought into contact with the second conductive region 244b and the third conductive structure 175a is brought into contact with the third conductive region 245a, the second conductive structure 174b and the third conductive structure 175a may be disposed to surround corner portions of the microphone 242.

As illustrated in FIG. 12B, the first conductive region 244a and the third conductive region 245a may be located on the same line. Likewise, the second conductive region 244b and the fourth conductive region 245b may be located on the same line. For example, a fourth virtual reference line L4 and a fifth virtual reference line L5 that are substantially perpendicular to the first reference line L1 may be defined. The first conductive region 244a and the third conductive region 245a may be located on the fourth reference line L4, and the second conductive region 244b and the fourth conductive region 245b may be located on the fifth reference line L5. According to the illustrated embodiment, the fourth reference line L4 and the fifth reference line L5 may be located between the first side surface 242a and the second side surface 242b of the microphone 242. Accordingly, when the first contact structure 174 is brought into contact with the first contact region 244 and the second contact structure 175 is brought into contact with the second contact region 245, the first contact structure 174 and the second contact structure 175 may support the microphone module 240 while being symmetrical to each other with respect to the microphone 242. The first contact structure 174 may be disposed to face a side surface of the microphone 242 that faces the +x-axis direction, and the second contact structure 175 may be disposed to face a side surface of the microphone 242 that faces the −x-axis direction.

As illustrated in FIG. 12C, the microphone 242 may be located between the fourth reference line L4 and the fifth reference line L5. For example, the fourth reference line L4 may be located in a higher position in the +y-axis direction than the first side surface 242a of the microphone 242 when the first surface 241a of the first circuit board 241 is viewed from above, and the fifth reference line L5 may be located in a higher position in the −y-axis direction than the second side surface 242b of the microphone 242 when the first surface 241a of the first circuit board 241 is viewed from above. According to the illustrated embodiment, the first conductive region 244a and the second conductive region 244b may be located on the second reference line L2, the third conductive region 245a and the fourth conductive region 245b may be located on the third reference line L3, the first conductive region 244a and the third conductive region 245a may be located on the fourth reference line L4, and the second conductive region 244b and the fourth conductive region 245b may be located on the fifth reference line L5. The microphone 242 may be surrounded by the second reference line L2, the third reference line L3, the fourth reference line L4, and the fifth reference line L5. Accordingly, the first conductive structure 174a, the second conductive structure 174b, the third conductive structure 175a, and the fourth conductive structure 175b may be disposed to surround corner portions of the microphone 242.

Figure 12D:
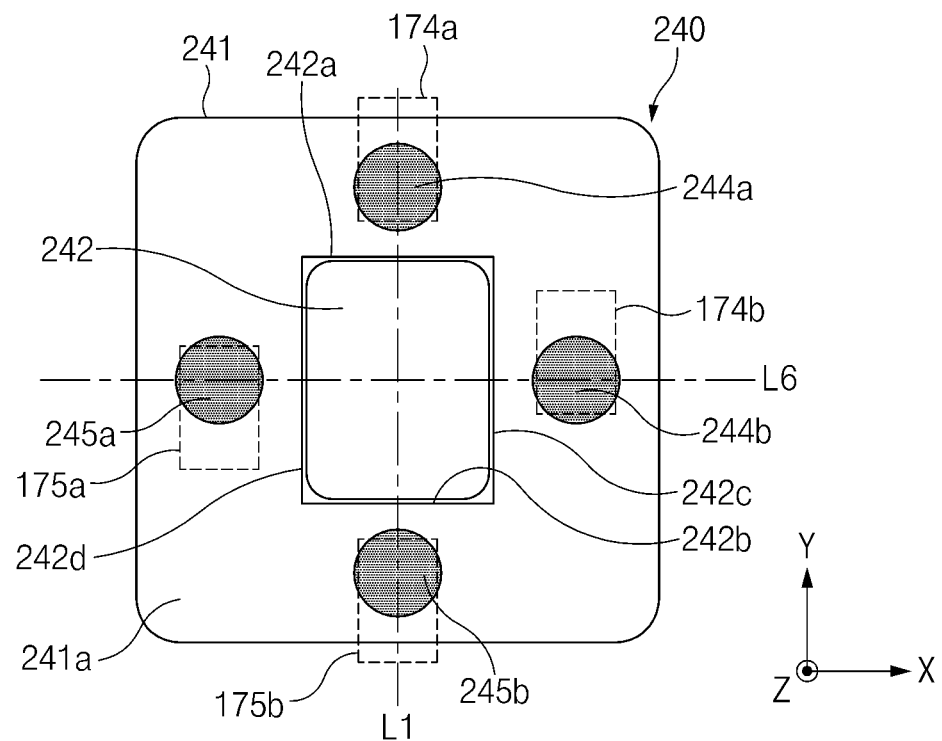

According to the embodiment illustrated in FIG. 12D, the first contact structure 174 and the second contact structure 175 may be disposed to face a plurality of side surfaces 242a, 242b, 242c, and 242d of the microphone 242. In an embodiment, the first conductive region 244a and the fourth conductive region 245b may be located on the same line, and the second conductive region 244b and the third conductive region 245a may be located on the same line. For example, the first virtual reference line L1 passing through the center of the microphone 242 and substantially parallel to the y-axis may be defined, and a sixth virtual reference line L6 substantially perpendicular to the first reference line L1 and passing through the microphone 242 may be defined. The first conductive region 244a and the fourth conductive region 245b may be located on the first reference line L1, and the second conductive region 244b and the third conductive region 245a may be located on the sixth reference line L6. For example, the first conductive region 244a and the fourth conductive region 245b may be symmetrical to each other with respect to the sixth reference line L6, and the second conductive region 244b and the third conductive region 245a may be symmetrical to each other with respect to the first reference line L1.

As illustrated in FIG. 12D, the first conductive structure 174a, the second conductive structure 174b, the third conductive structure 175a, and the fourth conductive structure 175b may be configured to surround the microphone 242 in four directions (e.g., the +x/−x-axis directions and the +y/−y-axis directions). For example, the first conductive region 244a may be disposed in the +y-axis direction with respect to the microphone 242, and the second conductive region 244b may be disposed in the +x-axis direction with respect to the microphone 242. The third conductive region 245a may be disposed in the −x-axis direction with respect to the microphone 242, and the fourth conductive region 245b may be disposed in the −y-axis direction with respect to the microphone 242. Accordingly, when the first contact structure 174 is brought into contact with the first contact region 244 and the second contact structure 175 is brought into contact with the second contact region 245, the first conductive structure 174a may face the first side surface 242a of the microphone 242, the second conductive structure 174b may face the third side surface 242c of the microphone 242, the third conductive structure 175a may face the fourth side surface 242d of the microphone 242, and the fourth conductive structure 175b may face the second side surface 242b of the microphone 242.

Figure 13:
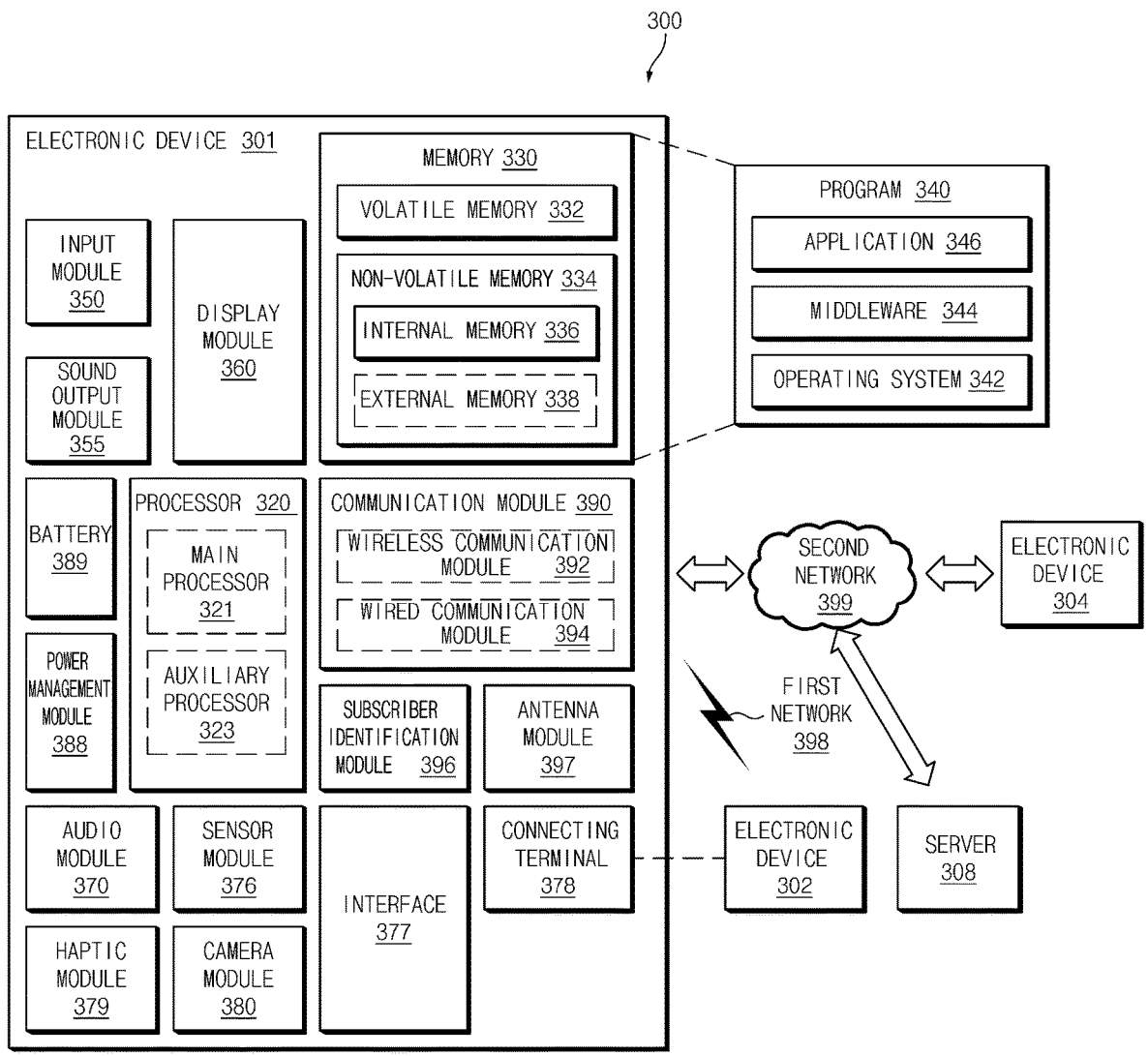
FIG. 13 is a block diagram illustrating an electronic device in a network environment, according to an embodiment.

FIG. 13 is a block diagram illustrating an electronic device in a network environment according to an embodiment.

Referring to FIG. 3, the electronic device 301 in the network environment 300 may communicate with an electronic device 302 via a first network 398 (e.g., a short-range wireless communication network), or at least one of an electronic device 304 or a server 308 via a second network 399 (e.g., a long-range wireless communication network). According to an embodiment, the electronic device 301 may communicate with the electronic device 304 via the server 308.

According to an embodiment, the electronic device 301 may include a processor 320, memory 330, an input module 350, a sound output module 355, a display module 360, an audio module 370, a sensor module 376, an interface 377, a connecting terminal 378, a haptic module 379, a camera module 380, a power management module 388, a battery 389, a communication module 390, a subscriber identification module (SIM) 396, or an antenna module 397. In some embodiments, at least one of the components (e.g., the connecting terminal 378) may be omitted from the electronic device 301, or one or more other components may be added in the electronic device 301. In some embodiments, some of the components (e.g., the sensor module 376, the camera module 380, or the antenna module 397) may be implemented as a single component (e.g., the display module 360).

The processor 320 may execute, for example, software (e.g., a program 340) to control at least one other component (e.g., a hardware or software component) of the electronic device 301 coupled with the processor 320, and may perform various data processing or computation. According to one embodiment, as at least part of the data processing or computation, the processor 320 may store a command or data received from another component (e.g., the sensor module 376 or the communication module 390) in volatile memory 332, process the command or the data stored in the volatile memory 332, and store resulting data in non-volatile memory 334. According to an embodiment, the processor 320 may include a main processor 321 (e.g., a central processing unit (CPU) or an application processor (AP)), or an auxiliary processor 323 (e.g., a graphics processing unit (GPU), a neural processing unit (NPU), an image signal processor (ISP), a sensor hub processor, or a communication processor (CP)) that is operable independently from, or in conjunction with, the main processor 321. For example, when the electronic device 301 includes the main processor 321 and the auxiliary processor 323, the auxiliary processor 323 may be adapted to consume less power than the main processor 321, or to be specific to a specified function. The auxiliary processor 323 may be implemented as separate from, or as part of the main processor 321.

The auxiliary processor 323 may control at least some of functions or states related to at least one component (e.g., the display module 360, the sensor module 376, or the communication module 390) among the components of the electronic device 301, instead of the main processor 321 while the main processor 321 is in an inactive (e.g., sleep) state, or together with the main processor 321 while the main processor 321 is in an active state (e.g., executing an application). According to an embodiment, the auxiliary processor 323 (e.g., an image signal processor or a communication processor) may be implemented as part of another component (e.g., the camera module 380 or the communication module 390) functionally related to the auxiliary processor 323. According to an embodiment, the auxiliary processor 323 (e.g., the neural processing unit) may include a hardware structure specified for artificial intelligence model processing. An artificial intelligence model may be generated by machine learning. Such learning may be performed, e.g., by the electronic device 301 where the artificial intelligence is performed or via a separate server (e.g., the server 308). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 330 may store various data used by at least one component (e.g., the processor 320 or the sensor module 376) of the electronic device 301. The various data may include, for example, software (e.g., the program 340) and input data or output data for a command related thereto. The memory 330 may include the volatile memory 332 or the non-volatile memory 334.

The program 340 may be stored in the memory 330 as software, and may include, for example, an operating system (OS) 342, middleware 344, or an application 346.

The input module 350 may receive a command or data to be used by another component (e.g., the processor 320) of the electronic device 301, from the outside (e.g., a user) of the electronic device 301. The input module 350 may include, for example, a microphone, a mouse, a keyboard, a key (e.g., a button), or a digital pen (e.g., a stylus pen).

The sound output module 355 may output sound signals to the outside of the electronic device 301. The sound output module 355 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 360 may visually provide information to the outside (e.g., a user) of the electronic device 301. The display module 360 may include, for example, a display, a hologram device, or a projector and control circuitry to control a corresponding one of the display, hologram device, and projector. According to an embodiment, the display module 360 may include a touch sensor adapted to detect a touch, or a pressure sensor adapted to measure the intensity of force incurred by the touch.

The audio module 370 may convert a sound into an electrical signal and vice versa. According to an embodiment, the audio module 370 may obtain the sound via the input module 350, or output the sound via the sound output module 355 or a headphone of an external electronic device (e.g., an electronic device 302) directly (e.g., wiredly) or wirelessly coupled with the electronic device 301.

The sensor module 376 may detect an operational state (e.g., power or temperature) of the electronic device 301 or an environmental state (e.g., a state of a user) external to the electronic device 301, and then generate an electrical signal or data value corresponding to the detected state. According to an embodiment, the sensor module 376 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 377 may support one or more specified protocols to be used for the electronic device 301 to be coupled with the external electronic device (e.g., the electronic device 302) directly (e.g., wiredly) or wirelessly. According to an embodiment, the interface 377 may include, for example, a high definition multimedia interface (HDMI), a universal serial bus (USB) interface, a secure digital (SD) card interface, or an audio interface.

A connecting terminal 378 may include a connector via which the electronic device 301 may be physically connected with the external electronic device (e.g., the electronic device 302). According to an embodiment, the connecting terminal 378 may include, for example, a HDMI connector, a USB connector, a SD card connector, or an audio connector (e.g., a headphone connector).

The haptic module 379 may convert an electrical signal into a mechanical stimulus (e.g., a vibration or a movement) or electrical stimulus which may be recognized by a user via his tactile sensation or kinesthetic sensation. According to an embodiment, the haptic module 379 may include, for example, a motor, a piezoelectric element, or an electric stimulator.

The camera module 380 may capture a still image or moving images. According to an embodiment, the camera module 380 may include one or more lenses, image sensors, image signal processors, or flashes.

The power management module 388 may manage power supplied to the electronic device 301. According to one embodiment, the power management module 388 may be implemented as at least part of, for example, a power management integrated circuit (PMIC).

The battery 389 may supply power to at least one component of the electronic device 301. According to an embodiment, the battery 389 may include, for example, a primary cell which is not rechargeable, a secondary cell which is rechargeable, or a fuel cell.

The communication module 390 may support establishing a direct (e.g., wired) communication channel or a wireless communication channel between the electronic device 301 and the external electronic device (e.g., the electronic device 302, the electronic device 304, or the server 308) and performing communication via the established communication channel. The communication module 390 may include one or more communication processors that are operable independently from the processor 320 (e.g., the application processor (AP)) and supports a direct (e.g., wired) communication or a wireless communication. According to an embodiment, the communication module 390 may include a wireless communication module 392 (e.g., a cellular communication module, a short-range wireless communication module, or a global navigation satellite system (GNSS) communication module) or a wired communication module 394 (e.g., a local area network (LAN) communication module or a power line communication (PLC) module). A corresponding one of these communication modules may communicate with the external electronic device via the first network 398 (e.g., a short-range communication network, such as Bluetooth™, wireless-fidelity (Wi-Fi) direct, or infrared data association (IrDA)) or the second network 399 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 392 may identify and authenticate the electronic device 301 in a communication network, such as the first network 398 or the second network 399, using subscriber information (e.g., international mobile subscriber identity (IMSI)) stored in the subscriber identification module 396.

The wireless communication module 392 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 392 may support a high-frequency band (e.g., the mmWave band) to achieve, e.g., a high data transmission rate. The wireless communication module 392 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 392 may support various requirements specified in the electronic device 301, an external electronic device (e.g., the electronic device 304), or a network system (e.g., the second network 399). According to an embodiment, the wireless communication module 392 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 397 may transmit or receive a signal or power to or from the outside (e.g., the external electronic device) of the electronic device 301. According to an embodiment, the antenna module 397 may include an antenna including a radiating element composed of a conductive material or a conductive pattern formed in or on a substrate (e.g., a printed circuit board (PCB)). According to an embodiment, the antenna module 397 may include a plurality of antennas (e.g., array antennas). In such a case, at least one antenna appropriate for a communication scheme used in the communication network, such as the first network 398 or the second network 399, may be selected, for example, by the communication module 390 (e.g., the wireless communication module 392) from the plurality of antennas. The signal or the power may then be transmitted or received between the communication module 390 and the external electronic device via the selected at least one antenna. According to an embodiment, another component (e.g., a radio frequency integrated circuit (RFIC)) other than the radiating element may be additionally formed as part of the antenna module 397.

According to various embodiments, the antenna module 397 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 301 and the external electronic device 304 via the server 308 coupled with the second network 399. Each of the electronic devices 302 or 304 may be a device of a same type as, or a different type, from the electronic device 301. According to an embodiment, all or some of operations to be executed at the electronic device 301 may be executed at one or more of the external electronic devices 302, 304, or 308. For example, if the electronic device 301 should perform a function or a service automatically, or in response to a request from a user or another device, the electronic device 301, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 301. The electronic device 301 may provide the outcome, with or without further processing of the outcome, as at least part of a reply to the request. To that end, a cloud computing, distributed computing, mobile edge computing (MEC), or client-server computing technology may be used, for example. The electronic device 301 may provide ultra low-latency services using, e.g., distributed computing or mobile edge computing. In another embodiment, the external electronic device 304 may include an internet-of-things (IoT) device. The server 308 may be an intelligent server using machine learning and/or a neural network. According to an embodiment, the external electronic device 304 or the server 308 may be included in the second network 399. The electronic device 301 may be applied to intelligent services (e.g., smart home, smart city, smart car, or healthcare) based on 5G communication technology or IoT-related technology.

An electronic device 100 according to an embodiment of the disclosure may include a housing 110 and 120 (e.g., the first housing 110). The electronic device 100 may further include a camera cover member 210, at least a portion of which is disposed in the housing 110 and 120, the camera cover member including a first through-hole 215 in fluid communication with the outside of the housing 110 and 120 and being configured to support at least a portion of a camera module 194 disposed in the housing 110 and 120 The electronic device 100 may further include a microphone module 240 disposed in the housing 110 and 120 so as to be adjacent to the camera module 194, the microphone module 240 including a first circuit board 241 disposed on the camera cover member 210 and a microphone 242 disposed on the first circuit board 241 The electronic device 100 may further include a second circuit board 170 (e.g., the first substrate 170-1) disposed to face the camera cover member 210 with the microphone module 240 therebetween, the second circuit board including a contact structure 173 that makes contact with at least a portion of the first circuit board 241. The contact structure 173 may be configured to electrically connect the first circuit board 241 and the second circuit board 170 and may be disposed to surround at least a portion of the microphone 242 between a surface of the first circuit board 241 and a surface of the second circuit board 170.

In various embodiments, the electronic device 100 may further include an adhesive member 250 that is disposed between the camera cover member 210 and the first circuit board 241 and that has a second through-hole 251 formed therein. The second through-hole 251 may be in fluid communication with the first through-hole 215. The electronic device 100 may further include a waterproof member 260 disposed in the second through-hole 251 and located between the camera cover member 210 and the first circuit board 241 to enclose the first through-hole 215.

In various embodiments, the camera cover member 210 may include a first seating surface 211 on which the microphone module 240 is disposed and a second seating surface 212 that faces opposite to the first seating surface 211. The adhesive member 250 and the waterproof member 260 may be disposed between a partial region of the first seating surface 211 and the first circuit board 241.

In various embodiments, the first seating surface 211 may include a microphone region 216 on which the microphone module 240 is disposed. The microphone region 216 may include a first region 216a on which the adhesive member 250 is disposed and a second region 216b on which the waterproof member 260 is disposed. The second region 216b may be connected to the first region 216a with a step in a direction toward the second seating surface 212.

In various embodiments, the first through-hole 215 may be formed in the second region 216b, and the waterproof member 260 may be configured to block movement of water, introduced from outside the housing, to the microphone 242 through the first through-hole 215.

In various embodiments, the camera cover member 210 may further include a sidewall portion 214 that surrounds a space between the first seating surface 211 and the second seating surface 212, and a microphone hole 219 in fluid communication with the first through-hole 215 may be formed in the sidewall portion 214.

In various embodiments, at least part of the sidewall portion 214 may protrude from a surface of the housing 110 and 120 by a predetermined height, and at least a portion of the microphone hole 219 may be configured to be in fluid communication with the outside of the housing 110 and 120.

In various embodiments, the waterproof member 260 may include a waterproof layer 261 including a waterproof material and adhesive layers 263 that are disposed on opposite surfaces of the waterproof layer 261 and that includes an adhesive material. The waterproof layer 261 may be disposed so as to be spaced apart from the first circuit board 241 by a predetermined gap.

In various embodiments, the first circuit board 241 may define a first surface 241a on which the microphone 242 is disposed and a second surface 241b opposite to the first surface 241a. A contact region 243 that makes contact with the contact structure 173 may be formed on the first surface 241a of the first circuit board 241.

In various embodiments, the contact region 243 and the contact structure 173 may each include a conductive material.

In various embodiments, the contact region 243 may include a first contact region and a second contact region respectively formed on opposite sides of the microphone 242 on the first surface 241a of the first circuit board 241.

In various embodiments, the contact structure 173 may include a first contact structure 174 that makes contact with the first contact region 244 and a second contact structure 175 that makes contact with the second contact region 245.

In various embodiments, each of the first contact region 244 and the second contact region 245 may include a plurality of conductive regions 244a, 244b, 245a, and 245b, and the first contact structure 174 and the second contact structure 175 may collectively include a plurality of conductive structures 174a, 174b, 175a, and 175b to correspond to the first contact region 244 and the second contact region 245.

In various embodiments of the disclosure, the first contact structure 174 and the second contact structure 175 may be disposed to face each other with the microphone 242 therebetween.

In various embodiments, the electronic device may further include a back cover 140 (e.g., the first back cover 140-1) that forms at least a portion of a rear surface of the electronic device 100 and a support member 180 (e.g., the first support member 180-1) disposed between the back cover 140 and the second circuit board 170. The camera cover member 210 may be coupled to the back cover 140 such that the microphone module 240 faces toward the second circuit board 170, and an open region 181 may be formed in the support member 180.

In various embodiments, the first circuit board 241 may define a first surface 241a on which the microphone 242 is disposed and a second surface 241b that faces away from the first surface 241a. The second circuit board 170 may define a third surface 171 on which the contact structure 173 is disposed, and at least a portion of the third surface 171 of the second circuit board 170 may be configured to face the first surface 241a of the first circuit board 241 through the open region 181 of the support member 180.

A foldable electronic device 100 according to an embodiment of the disclosure may include a housing structure 110 and 120 including a first housing 110 and a second housing 120 that are folded or unfolded about a folding axis F. The foldable electronic device 100 may further include a hinge module 161 that connects the first housing 110 and 120 and the second housing 120 such that the first housing and the second housing are rotatable relative to each other. The foldable electronic device 100 may further include a flexible display 150 that extends from a portion of the first housing 110 and 120 to a portion of the second housing 120. The foldable electronic device 100 may further include a camera cover member 210, at least a portion of which is disposed in the first housing 110 and 120, the camera cover member including a first through-hole 215 in fluid communication with the outside of the first housing 110 and 120 and being configured to support at least a portion of a camera module 194 disposed in the first housing 110 and 120. The foldable electronic device 100 may further include a microphone module 240 disposed in the first housing 110 so as to be adjacent to the camera module 194, the microphone module 240 including a first circuit board 241 disposed on the camera cover member 210 and a microphone 242 disposed on the first circuit board 241. The foldable electronic device 100 may further include an adhesive member 250 disposed between the camera cover member 210 and the first circuit board 241, the adhesive member having a second through-hole 251 formed therein, the second through-hole being in fluid communication with the first through-hole 215. The foldable electronic device 100 may further include a waterproof member 260 disposed in the second through-hole 251, the waterproof member being located between the camera cover member 210 and the first circuit board 241 to cover the first through-hole 215. The foldable electronic device 100 may further include a second circuit board 170 (e.g., the first substrate 170-1) disposed to face the camera cover member 210 with the microphone module 240 therebetween, the second circuit board including a contact structure 173 that makes contact with at least a portion of the first circuit board 241. The contact structure 173 may be configured to electrically connect the first circuit board 241 and the second circuit board 170 and may be disposed to surround at least a portion of the microphone 242 between one surface of the first circuit board 241 and one surface of the second circuit board 170.

In various embodiments, the first circuit board 241 may define a first surface 241a on which the microphone 242 is disposed and a second surface 241b opposite to the first surface 241a. A contact region 243 brought into contact with the contact structure 173 may be formed on the first surface 241a of the first circuit board 241. The contact region 243 may include a first contact region 244 and a second contact region respectively formed on opposite sides of the microphone 242 on the first surface 241a of the first circuit board 241.

In various embodiments, the contact structure 173 may include a first contact structure 174 that makes contact with the first contact region 244 and a second contact structure 175 that makes contact with the second contact region 245. The microphone 242 may be configured to be located between the first contact structure 174 and the second contact structure 175 when the first contact structure 174 makes contact with the first contact region 244 and the second contact structure 175 makes contact with the second contact region 245.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 340) including one or more instructions that are stored in a storage medium (e.g., internal memory 336 or external memory 338) that is readable by a machine (e.g., the electronic device 301). For example, a processor (e.g., the processor 320) of the machine (e.g., the electronic device 301) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
a housing;
a camera cover member, at least a portion of which is disposed in the housing, the camera cover member comprising a first through-hole in fluid communication with the outside of the housing, wherein the camera cover member is configured to support at least a portion of a camera module disposed in the housing;
a microphone module disposed in the housing so as to be adjacent to the camera module, the microphone module comprising a first circuit board disposed on the camera cover member, and a microphone disposed on the first circuit board; and
a second circuit board disposed to face the camera cover member with the microphone module therebetween, the second circuit board comprising a contact structure configured to make contact with at least a portion of the first circuit board,
wherein the contact structure is configured to electrically connect the first circuit board and the second circuit board and disposed to surround at least a portion of the microphone between a surface of the first circuit board and a surface of the second circuit board.

2. The electronic device of claim 1, further comprising:
an adhesive member disposed between the camera cover member and the first circuit board, the adhesive member having a second through-hole formed therein, the second through-hole being in fluid communication with the first through-hole; and
a waterproof member disposed in the second through-hole, the waterproof member being located between the camera cover member and the first circuit board to enclose the first through-hole.

3. The electronic device of claim 2, wherein the camera cover member comprises a first seating surface on which the microphone module is disposed, and a second seating surface configured to face opposite to the first seating surface, and
wherein the adhesive member and the waterproof member are disposed between the first seating surface and the first circuit board.

4. The electronic device of claim 3, wherein the first seating surface comprises a microphone region on which the microphone module is disposed,
wherein the microphone region comprises a first region on which the adhesive member is disposed and a second region on which the waterproof member is disposed, and
wherein the second region is connected to the first region with a step in a direction toward the second seating surface.

5. The electronic device of claim 4, wherein the first through-hole is formed in the second region, and
wherein the waterproof member is configured to block movement of water, introduced from outside the housing, to the microphone through the first through-hole.

6. The electronic device of claim 3, wherein the camera cover member further comprises a sidewall portion configured to surround a space between the first seating surface and the second seating surface, and
wherein a microphone hole in fluid communication with the first through-hole is formed in the sidewall portion.

7. The electronic device of claim 6, wherein at least part of the sidewall portion protrudes from a surface of the housing by a predetermined height, and
wherein at least a portion of the microphone hole is configured to be in fluid communication with the outside of the housing.

8. The electronic device of claim 2, wherein the waterproof member comprises:
a waterproof layer comprising a waterproof material, and
adhesive layers disposed on opposite surfaces of the waterproof layer and comprising an adhesive material, and
wherein the waterproof layer is disposed so as to be spaced apart from the first circuit board by a predetermined gap.

9. The electronic device of claim 1, wherein the first circuit board defines a first surface on which the microphone is disposed, and a second surface opposite to the first surface, and
wherein a contact region configured to make contact with the contact structure is formed on the first surface of the first circuit board.

10. The electronic device of claim 9, wherein the contact region and the contact structure each comprise a conductive material.

11. The electronic device of claim 9, wherein the contact region comprises a first contact region and a second contact region respectively formed on opposite sides of the microphone on the first surface of the first circuit board.

12. The electronic device of claim 11, wherein the contact structure comprises a first contact structure configured to make contact with the first contact region and a second contact structure configured to make contact with the second contact region.

13. The electronic device of claim 12, wherein each of the first contact region and the second contact region comprises a plurality of conductive regions, and
wherein the first contact structure and the second contact structure collectively comprise a plurality of conductive structures to correspond to the first contact region and the second contact region.

14. The electronic device of claim 12, wherein the first contact structure and the second contact structure are disposed to face each other with the microphone therebetween.

15. The electronic device of claim 11, wherein the first contact region and the second contact region are spaced apart from the microphone by substantially the same distance.

16. The electronic device of claim 1, further comprising:
a back cover configured to form at least a portion of a rear surface of the electronic device; and
a support member disposed between the back cover and the second circuit board,
wherein the camera cover member is coupled to the back cover such that the microphone module faces toward the second circuit board, and wherein an open region is formed in the support member.

17. The electronic device of claim 16, wherein the first circuit board defines a first surface on which the microphone is disposed and a second surface configured to face away from the first surface, wherein the second circuit board defines a third surface on which the contact structure is disposed, and wherein at least a portion of the third surface of the second circuit board is configured to face the first surface of the first circuit board through the open region of the support member.

18. A foldable electronic device comprising:

a housing structure comprising a first housing and a second housing configured to be folded or unfolded about a folding axis;

a hinge module configured to connect the first housing and the second housing such that the first housing and the second housing are rotatable relative to each other;

a flexible display configured to extend from a portion of the first housing to a portion of the second housing;

a camera cover member, at least a portion of which is disposed in the first housing, the camera cover member comprising a first through-hole in fluid communication with the outside of the first housing, wherein the camera cover member is configured to support at least a portion of a camera module disposed in the first housing;

a microphone module disposed in the first housing so as to be adjacent to the camera module, the microphone module comprising a first circuit board disposed on the camera cover member, and a microphone disposed on the first circuit board;

an adhesive member disposed between the camera cover member and the first circuit board, the adhesive member having a second through-hole formed therein, the second through-hole being in fluid communication with the first through-hole;

a waterproof member disposed in the second through-hole, the waterproof member being located between the camera cover member and the first circuit board to enclose the first through-hole; and a second circuit board disposed to face the camera cover member with the microphone module therebetween, the second circuit board comprising a contact structure configured to make contact with at least a portion of the first circuit board, wherein the contact structure is configured to electrically connect the first circuit board and the second circuit board and disposed to surround at least a portion of the microphone between a surface of the first circuit board and a surface of the second circuit board.

19. The foldable electronic device of claim 18, wherein the first circuit board defines a first surface on which the microphone is disposed, and a second surface opposite to the first surface, wherein a contact region brought into contact with the contact structure is formed on the first surface of the first circuit board, and wherein the contact region comprises a first contact region and a second contact region respectively formed on opposite sides of the microphone on the first surface of the first circuit board.

20. The foldable electronic device of claim 19, wherein the contact structure comprises a first contact structure configured to make contact with the first contact region and a second contact structure configured to make contact with the second contact region, and wherein the microphone is configured to be located between the first contact structure and the second contact structure when the first contact structure makes contact with the first contact region and the second contact structure makes contact with the second contact region.

* * * * *